US012733682B2

(12) United States Patent
Dendy et al.

(10) Patent No.: US 12,733,682 B2
(45) **Date of Patent: *Sep. 15, 2026**

(54) ELECTRONIC VAPING DEVICE, BATTERY SECTION, AND CHARGER

(71) Applicant: Altria Client Services LLC, Richmond, VA (US)

(72) Inventors: Charles Dendy, Ruther Glen, VA (US); Phillip Diana, Richmond, VA (US); Isaac Weigensberg, Richmond, VA (US); Kai Cao, Somerville, MA (US); Patrick J. Cobler, Andover, MA (US); Paul Butler, Methuen, MA (US)

(73) Assignee: Altria Client Services LLC, Richmond, VA (US)

( * ) Notice: Subject to any disclaimer, the term of this patent is extended or adjusted under 35 U.S.C. 154(b) by 769 days.

This patent is subject to a terminal disclaimer.

(21) Appl. No.: 18/295,038

(22) Filed: Apr. 3, 2023

(65) Prior Publication Data

US 2023/0240372 A1 Aug. 3, 2023

Related U.S. Application Data

(60) Continuation of application No. 16/925,611, filed on Jul. 10, 2020, now Pat. No. 11,641,882, which is a (Continued)

(51) Int. Cl.

*A24F 40/50* (2020.01)
*A24F 40/90* (2020.01)

(Continued)

(52) U.S. Cl.

CPC .............. *A24F 40/50* (2020.01); *A24F 40/90* (2020.01); *G01R 31/389* (2019.01);

(Continued)

(58) Field of Classification Search

CPC .. H01M 10/48; H01M 50/204; H01M 50/247; H01M 50/213; H01M 10/46;

(Continued)

(56) References Cited

U.S. PATENT DOCUMENTS 5,230,837 A 7/1993 Babasade
5,801,514 A 9/1998 Saeki et al.

(Continued)

FOREIGN PATENT DOCUMENTS

CN 201094280 Y 8/2008
CN 201238610 Y 5/2009

(Continued)

OTHER PUBLICATIONS

Chinese Office Action for Chinese Application No. 202210371005 and English translation thereof mailed Jan. 16, 2025.

(Continued)

*Primary Examiner* — Phuong T Nguyen
(74) *Attorney, Agent, or Firm* — Harness, Dickey & Pierce, P.L.C.

(57) ABSTRACT

A battery section of an electronic vaping device may include a housing extending in a longitudinal direction, the housing having a first end and a second end, a power supply in the housing, a control circuit in the housing, and a conductive contact assembly at the second end of the housing, the contact assembly electrically connecting the power supply and the control circuit. The contact assembly is configured to receive external power and at least one command.

24 Claims, 14 Drawing Sheets

Related U.S. Application Data division of application No. 15/224,608, filed on Jul. 31, 2016, now Pat. No. 10,729,177.

(51) Int. Cl.

| | |
|---|---|
| ***G01R 31/389*** | (2019.01) |
| ***H01M 10/46*** | (2006.01) |
| ***H01M 10/48*** | (2006.01) |
| ***H01M 50/213*** | (2021.01) |
| ***H02J 7/00*** | (2006.01) |
| ***H02J 7/70*** | (2026.01) |
| ***H02J 7/82*** | (2026.01) |
| ***H05B 1/02*** | (2006.01) |

(52) U.S. Cl.

CPC .......... *H01M 10/46* (2013.01); *H01M 10/48* (2013.01); *H01M 50/213* (2021.01); *H02J 7/00* (2013.01); *H02J 7/70* (2026.01); *H02J 7/82* (2026.01); *H05B 1/0244* (2013.01); *H01M 2220/30* (2013.01); *H05B 2203/021* (2013.01)

(58) Field of Classification Search

CPC ............ H01M 2220/30; H05B 1/0244; H05B 2203/021; A24F 40/90; A24F 40/50; H02J 7/00; H02J 7/0042; H02J 7/0048; G01R 31/389

USPC ............... 392/386, 390, 395, 403, 404, 405

See application file for complete search history.

(56) References Cited

U.S. PATENT DOCUMENTS 6,087,815 A 7/2000 Pfeifer et al.
6,118,248 A 9/2000 Gartstein et al.
6,196,218 B1 3/2001 Voges
6,198,250 B1 3/2001 Gartstein et al.
6,304,060 B1 10/2001 Dernehl
6,361,752 B1 3/2002 Demarest et al.
6,394,851 B1 5/2002 Paciorek
6,661,967 B2 12/2003 Levine et al.
6,792,199 B2 9/2004 Levine et al.
6,835,491 B2 12/2004 Gartstein et al.
6,889,687 B1 5/2005 Olsson
6,957,982 B1 10/2005 Hyland et al.
7,091,695 B2 8/2006 Miyazaki et al.
D618,224 S 6/2010 Tong et al.
8,003,922 B2 8/2011 Seger
D669,027 S 10/2012 Kumpula et al.
8,375,957 B2 2/2013 Hon
8,450,972 B2 5/2013 Cacioppo et al.
8,511,318 B2 8/2013 Hon
D704,629 S 5/2014 Liu
D704,634 S 5/2014 Eidelman et al.
8,833,364 B2 9/2014 Buchberger
8,847,930 B2 9/2014 Boyd et al.
8,851,068 B2 10/2014 Cohen et al.
8,863,753 B2 10/2014 Li et al.
8,897,628 B2 11/2014 Conley et al.
8,899,239 B2 12/2014 Hon
8,907,617 B2 12/2014 Ichikawa et al.
8,973,587 B2 3/2015 Liu
9,032,968 B2 5/2015 Glasberg et al.
9,066,543 B2 6/2015 Cameron
D733,650 S 7/2015 Liu
D736,148 S 8/2015 Liu
D736,150 S 8/2015 Liu
D736,702 S 8/2015 Ovadia
D736,704 S 8/2015 Liu
D737,201 S 8/2015 Liu
9,155,336 B2 10/2015 Liu
9,188,325 B2 11/2015 Tinaphong et al.
9,197,726 B2 11/2015 Stanimirovic et al.
D744,419 S 12/2015 Bowen et al.
9,247,773 B2 2/2016 Memari et al.
D751,502 S 3/2016 Riner
9,282,772 B2 3/2016 Tucker et al.
9,289,014 B2 3/2016 Tucker et al.
9,426,977 B1 8/2016 Wynalda, Jr.
9,427,023 B2 8/2016 Liu
9,549,573 B2 1/2017 Monsees et al.
9,943,110 B2 4/2018 Liu
10,937,999 B2 3/2021 Takahashi et al.
2002/0047008 A1 4/2002 Snowball
2002/0078956 A1 6/2002 Sharpe et al.
2003/0230567 A1 12/2003 Centanni et al.
2006/0219962 A1 10/2006 Dancs et al.
2006/0267558 A1 11/2006 Petz et al.
2007/0096563 A1 5/2007 Atluri et al.
2007/0278998 A1 12/2007 Koyama
2008/0050645 A1 2/2008 Kai
2008/0092912 A1 4/2008 Robinson et al.
2008/0144341 A1 6/2008 Cook
2008/0224687 A1 9/2008 Breese et al.
2008/0252252 A1 10/2008 Wong
2009/0063067 A1 3/2009 Sekizaki et al.
2009/0272379 A1 11/2009 Thorens et al.
2009/0299328 A1 12/2009 Mudd et al.
2011/0011396 A1 1/2011 Fang
2011/0036346 A1 2/2011 Cohen et al.
2011/0193525 A1 8/2011 Ro
2011/0199028 A1 8/2011 Yamazaki et al.
2011/0210118 A1 9/2011 Hirochi et al.
2011/0226236 A1 9/2011 Buchberger
2011/0265806 A1 11/2011 Alarcon et al.
2011/0277756 A1 11/2011 Terry et al.
2011/0303231 A1 12/2011 Li et al.
2012/0109687 A1 5/2012 Tubb
2012/0179399 A1 7/2012 Yun et al.
2012/0234315 A1 9/2012 Li et al.
2013/0042865 A1 2/2013 Monsees et al.
2013/0087160 A1 4/2013 Gherghe
2013/0143090 A1 6/2013 Hosoya et al.
2013/0176738 A1 7/2013 Tinaphong et al.
2013/0192623 A1 8/2013 Tucker et al.
2013/0199528 A1 8/2013 Goodman et al.
2013/0220315 A1 8/2013 Conley et al.
2013/0231532 A1 9/2013 Makino
2013/0284192 A1 10/2013 Peleg et al.
2013/0298905 A1 11/2013 Levin et al.
2013/0306692 A1 11/2013 Mangum et al.
2013/0312742 A1 11/2013 Monsees et al.
2013/0319407 A1 12/2013 Liu
2013/0340750 A1 12/2013 Thorens et al.
2013/0341218 A1 12/2013 Liu
2014/0004548 A1 1/2014 Gordon et al.
2014/0007891 A1 1/2014 Liu
2014/0014124 A1 1/2014 Glasberg et al.
2014/0096781 A1 4/2014 Sears et al.
2014/0096782 A1 4/2014 Ampolini et al.
2014/0123982 A1 5/2014 Maddock
2014/0123989 A1 5/2014 LaMothe
2014/0123990 A1 5/2014 Timmermans
2014/0125289 A1 5/2014 Tonomura
2014/0184165 A1* 7/2014 Takahashi ............ H01M 10/48 429/90
2014/0184172 A1 7/2014 Momo
2014/0190477 A1 7/2014 Qiu
2014/0197802 A1 7/2014 Yamazaki
2014/0205272 A1 7/2014 Midgette et al.
2014/0224267 A1 8/2014 Levitz et al.
2014/0238424 A1 8/2014 Macko et al.
2014/0239905 A1 8/2014 Yamazaki
2014/0261408 A1 9/2014 DePiano et al.
2014/0261486 A1 9/2014 Potter et al.
2014/0261489 A1 9/2014 Cadieux et al.
2014/0270729 A1 9/2014 DePiano et al.
2014/0283824 A1 9/2014 Wheelock et al.
2014/0305453 A1 10/2014 Hon
2014/0321837 A1 10/2014 Flick
2014/0332016 A1 11/2014 Bellinger et al.
2014/0332019 A1 11/2014 Liu

(56) References Cited

U.S. PATENT DOCUMENTS

| | | | |
|---|---|---|---|
| 2014/0334802 | A1 | 11/2014 | Dubief |
| 2014/0338458 | A1 | 11/2014 | Wang et al. |
| 2014/0346689 | A1 | 11/2014 | Dubief |
| 2014/0353856 | A1 | 12/2014 | Dubief |
| 2015/0020825 | A1 | 1/2015 | Galloway et al. |
| 2015/0020831 | A1 | 1/2015 | Weigensberg et al. |
| 2015/0053217 | A1 | 2/2015 | Steingraber et al. |
| 2015/0059779 | A1 | 3/2015 | Alarcon et al. |
| 2015/0059787 | A1 | 3/2015 | Qiu |
| 2015/0101625 | A1 | 4/2015 | Newton et al. |
| 2015/0102777 | A1 | 4/2015 | Cooper |
| 2015/0121610 | A1 | 5/2015 | Cornelius et al. |
| 2015/0125725 | A1 | 5/2015 | Zhou |
| 2015/0150305 | A1 | 6/2015 | Shenkal |
| 2015/0181937 | A1 | 7/2015 | Dubief et al. |
| 2015/0208726 | A1 | 7/2015 | Liu |
| 2015/0208729 | A1 | 7/2015 | Monsees et al. |
| 2015/0224268 | A1 | 8/2015 | Henry et al. |
| 2015/0245662 | A1 | 9/2015 | Memari et al. |
| 2015/0263542 | A1 | 9/2015 | Sato et al. |
| 2015/0272223 | A1 | 10/2015 | Weigensberg et al. |
| 2015/0295426 | A1 | 10/2015 | Hirosawa et al. |
| 2015/0305409 | A1 | 10/2015 | Verleur et al. |
| 2015/0320116 | A1 | 11/2015 | Bleloch et al. |
| 2015/0333552 | A1 | 11/2015 | Alarcon |
| 2015/0359263 | A1 | 12/2015 | Bellinger |
| 2016/0021934 | A1 | 1/2016 | Cadieux et al. |
| 2016/0057811 | A1 | 2/2016 | Alarcon et al. |
| 2016/0066619 | A1 | 3/2016 | Di Carlo |
| 2016/0099592 | A1 | 4/2016 | Gatta et al. |
| 2016/0118689 | A1 | 4/2016 | Oguni |
| 2016/0143354 | A1 | 5/2016 | Liu |
| 2016/0174611 | A1 | 6/2016 | Monsees et al. |
| 2016/0249684 | A1 | 9/2016 | Liu |
| 2016/0294207 | A1 | 10/2016 | Lau |
| 2016/0309785 | A1 | 10/2016 | Holtz |
| 2016/0309786 | A1 | 10/2016 | Holtz et al. |
| 2016/0374397 | A1 | 12/2016 | Jordan et al. |
| 2017/0325502 | A1 | 11/2017 | Nelson et al. |

FOREIGN PATENT DOCUMENTS

| | | | |
|---|---|---|---|
| CN | 101606758 | A | 12/2009 |
| CN | 201894184 | U | 7/2011 |
| CN | 202474905 | U | 10/2012 |
| CN | 203116086 | U | 8/2013 |
| CN | 203313149 | U | 11/2013 |
| CN | 203314105 | U | 12/2013 |
| CN | 203339772 | U | 12/2013 |
| CN | 203676136 | U | 7/2014 |
| CN | 105163611 | A | 12/2015 |
| GB | 2528711 | A | 2/2016 |
| JP | 2012090427 | A | 5/2012 |
| JP | 2013-524835 | A | 6/2013 |
| JP | 2015-500647 | A | 1/2015 |
| JP | 2015-533476 | A | 11/2015 |
| KR | 20110132290 | A | 12/2011 |
| KR | 2014-0114554 | A | 9/2014 |
| KR | 10-1512415 | B1 | 4/2015 |
| KR | 20160102293 | A | 8/2016 |
| RU | 2011141823 | A | 4/2013 |
| RU | 150594 | U1 | 2/2015 |
| WO | WO-2014147470 | A2 | 9/2014 |
| WO | WO-2015/127429 | A1 | 8/2015 |
| WO | WO-2016/012811 | A1 | 1/2016 |
| WO | WO-2016016620 | A1 | 2/2016 |
| WO | WO-2016/059073 | A1 | 4/2016 |

OTHER PUBLICATIONS

Japanese Office Action and English translation thereof dated May 30, 2023.

Japanese Decision to Grant and English translation thereof dated Oct. 19, 2023.

Brown et al., Electronic Cigarettes: Product Characterisation and Design Considerations, Mar. 4, 2014, http://tobaccocontrol.bmj.com/content/23/suppl_2/ii4.full.pdf+html.

Zainy.net, Electronic Cigarette USB Charging Cable Ego Charger works with EGO Series Battery, Apr. 15, 2016, http://zainy.net/home/380-electronic-cigarette-usb-charging-cable-ego-charger-works-with-ego-series-battery.html.

Amazon, Premium Electronic Vapor Cigarette USB Charger (female)—pack of 2—Apr. 14, 2016—http://www.amazon.com/Premium-electronic-cigarette-charger-female/dp/B00BMS8E0C.

White Rhino—Liquid Touch Vaporizer, retreived on Jan. 18, 2016—http://www.whiterhinoproducts.com/products/liquid-touch-vaporizer.

SmileNvape—smileNvape Touch Starter Kit, retreived on Jan. 18, 2016—http://smilenvape.com/e-cigs/smilen-touch-starter-kit/touch-start-kit.html.

International Search Report and Written Opinion issued Sep. 19, 2017 in PCT/EP2017/069360.

Notification concerning Informal Communications with the Applicant issued Nov. 16, 2018 in International Application No. PCT/EP2017/069360.

International Preliminary Report on Patentability issued Mar. 12, 2019 in International Application No. PCT/EP2017/069360.

Notice of Allowance issued Mar. 17, 2020 in Kazak Patent Application No. 2019/0134.1.

Search Report and Written Opinion issued Mar. 18, 2020 in Singaporean Application No. 11201900124R.

Non-Final Office Action issued on Feb. 8, 2019 in U.S. Appl. No. 15/224,608.

Final Office Action issued on Sep. 9, 2019 in U.S. Appl. No. 15/224,608.

Notice of Allowance issued on Apr. 7, 2020 in U.S. Appl. No. 15/224,608.

Notice of Eligibility for Grant and Examination Report issued on Oct. 6, 2020 in Singapore Application No. 11201900124R.

Official Action and Search Report issued Jan. 29, 2021 in Russian Application No. 2019105305/07(010166).

Written Opinion of the International Preliminary Examining Authority issued Jul. 10, 2018 in International Application No. PCT/EP2017/069360.

Decision to Grant issued May 26, 2021 in Russian Application No. 2019105305/07(010166).

First Office Action issued Jun. 10, 2021 in Chinese Application No. 201780042401.5.

Notice of Grounds for Rejection issued Jun. 14, 2021 in Japanese Application No. P 2019-503296.

Chinese Office Action and English translation thereof dated Oct. 18, 2021.

Japanese Decision to Grant and English translation thereof dated May 25, 2022.

Extended European Search Report dated Jun. 21, 2022.

Korean Office Action and English translation thereof dated Dec. 8, 2022.

Korean Notice of Allowance for Korean Application No. 10-2019-7002866 and English translation thereof mailed Nov. 21, 2023.

Korean Office Action for Korean Application No. 2024-7005648 and English translation thereof mailed Apr. 29, 2024.

Korean Office Action and English translation thereof dated Jun. 19, 2023.

Korean Notice of Allowance and English translation thereof for Korean Applicaion No. 10-2024-7005648 mailed Jan. 22, 2025.

* cited by examiner

ELECTRONIC VAPING DEVICE, BATTERY SECTION, AND CHARGER

CROSS-REFERENCE TO RELATED APPLICATIONS

This application is a Continuation application of, and claims priority under 35 U.S.C. § 120 to, U.S. application Ser. No. 16/925,611, filed on Jul. 10, 2020, which is a Divisional application of, and claims priority under 35 U.S.C. § 120 to, U.S. application Ser. No. 15/224,608, filed on Jul. 31, 2016, the entire contents of each of which are incorporated herein by reference.

BACKGROUND

Field

The present disclosure relates to an electronic vaping or e-vaping device.

Description of Related Art

An e-vaping device includes a heater element which vaporizes a pre-vapor formulation to produce a "vapor."

The e-vaping device includes a power supply, such as a rechargeable battery, arranged in the device. The battery is electrically connected to the heater, such that the heater heats to a temperature sufficient to convert the pre-vapor formulation to a vapor. The vapor exits the e-vaping device through a mouthpiece including at least one outlet.

SUMMARY

At least one example embodiment relates to a battery section of an electronic vaping device.

In at least one example embodiment, a battery section of an electronic vaping device may comprise a housing extending in a longitudinal direction, the housing having a first end and a second end, a power supply in the housing, a control circuit in the housing, and a conductive contact assembly at the second end of the housing, the contact assembly electrically connecting the power supply and the control circuit, the contact assembly configured to receive external power and at least one command.

In at least one example embodiment, the control circuit is configured to detect at least one of a change in resistance and a change in capacitance so as to detect the at least one command.

In at least one example embodiment, the contact assembly comprises a charge anode and a charge cathode. The control circuit comprises a switch configured to electrically separate the charge cathode from a common ground plane.

In at least one example embodiment, the contact assembly comprises a first contact and a second contact insulated from the first contact. One of the first contact and the second contact is generally ring-shaped and one of the first contact and the second contact forms at least a portion of an end wall of the battery section. The end wall extends generally transverse to the longitudinal direction. The first contact may be the end wall and the second contact may be generally ring-shaped, and may extend about a perimeter of the end wall. The end wall may be substantially opaque.

In at least one example embodiment, the contact assembly may further comprise an end cap housing configured to hold the first contact therein, the end cap housing including at least one slot. The second contact may be integrally formed with at least one tab extending in the longitudinal direction. The at least one tab may be configured to be received in the at least one slot. The end cap housing may include a generally cylindrical sidewall. The sidewall defining an orifice extending through the end cap housing. A first portion of the generally cylindrical sidewall is received within the housing at the second end thereof. A second portion of the sidewall is not within the housing. The second portion may be substantially transparent. The end wall may include a printed circuit board.

In at least one example embodiment, at least one of the first contact and the second contact may be magnetic. At least one of the first contact and the second contact is formed of at least one of stainless steel, gold, or silver.

At least one example embodiment relates to an electronic vaping device.

In at least one example embodiment, an electronic vaping device comprises a housing extending in a longitudinal direction, the housing having a first end and a second end, a power supply in the housing, a control circuit in the housing, a conductive contact assembly at the second end of the housing, a reservoir configured to contain a pre-vapor formulation, and a heater configured to heat the pre-vapor formulation, the heater electrically connected to the power supply. The contact assembly electrically connects the power supply and the control circuit. The contact assembly may be configured to receive external power and at least one command.

In at least one example embodiment, the control circuit is configured to detect at least one of a change in resistance and a change in capacitance so as to detect the at least one command.

In at least one example embodiment, the contact assembly comprises a charge anode and a charge cathode. The control circuit comprises a switch configured to electrically separate the charge cathode from a common ground plane. The contact assembly comprises a first contact and a second contact insulated from the first contact. The second contact may be generally ring-shaped and the first contact may form at least a portion of an end wall. The end wall of the battery section may extend generally transverse to the longitudinal direction.

In at least one example embodiment, the contact assembly further comprises an end cap housing configured to hold the first contact therein. The end cap housing may include at least one slot. The second contact may be integrally formed with at least one tab extending in the longitudinal direction. The at least one tab is configured to be received in the at least one slot.

In at least one example embodiment, the electronic vaping device includes a battery section and a first section. The battery section may contain the power supply, the control circuit, and the conductive contact assembly. The first section may contain the reservoir and the heater At least one example embodiment relates to a USB charger.

In at least one example embodiment, a USB charger comprises a housing. The housing includes a top wall having a charging slot therein, a first charger contact in the charging slot, a second charger contact in the charging slot, a bottom wall opposite the top wall, and at least one sidewall between the top wall and the bottom wall. The charging slot may be configured to receive an end of the electronic vaping device. The charger also includes at least one magnet adjacent the charging slot. The charger may also include a light pipe surrounding the charging slot and extending from the charging slot to an external surface of the USB charger. The light pipe may be configured to communicate and/or transmit light from an electronic vaping device to the external surface of the USB charger indicate charge status of the electronic vaping device. The housing defines an internal compartment. The charger may further comprise charger circuitry contained within the internal compartment. The charger circuitry is in communication with the first charger contact and the second charger contact.

At least one example embodiment relates to a battery section of an electronic vaping device.

In at least one example embodiment, the battery section comprises a housing extending in a longitudinal direction, the housing having a first end and a second end, a power supply in the housing, a conductive contact assembly at the second end of the housing, the contact assembly electrically connecting the power supply and the control circuit, and a control circuit in the housing configured to detect at least one of a change in resistance and a change in capacitance so as to detect input of the at least one command. The contact assembly is configured to receive external power and at least one command. The contact assembly may include a charge anode and a charge cathode. The control circuit comprises a switch configured to electrically separate the charge cathode from a common ground plane.

At least one other example embodiment provides an electronic vaping device including a battery section. The battery section includes: a first housing extending in a longitudinal direction; a power supply in the first housing, the power supply configured to provide power to a heater coil when the battery section is engaged with a cartridge section including a reservoir and the heater coil; and a control circuit including a resistance measurement circuit and a controller. The control circuit is configured to: measure an initial resistance of the heater coil in the analog domain; calculate a reference resistance of the heater coil in the digital domain based on the measured initial resistance; measure a current resistance of the heater coil in response to detection of a puff event; calculate a percentage change in resistance of the heater coil based on the measured current resistance and the reference resistance of the heater coil; and control power to the heater coil based on the calculated percentage change in resistance of the heater coil.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION OF EXAMPLE EMBODIMENTS

Figures 1, 2:
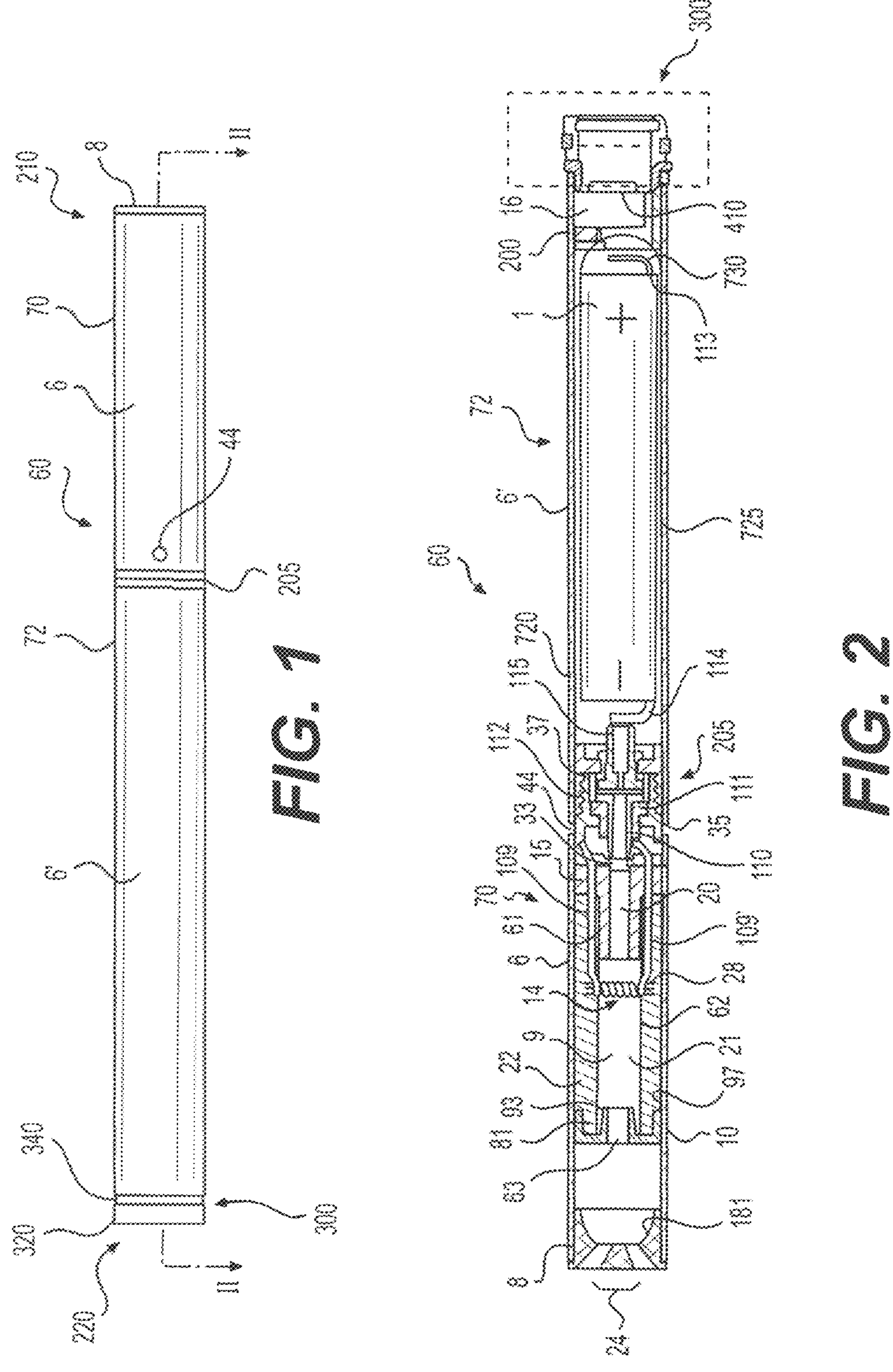
FIG. 1 is a side view of an e-vaping device according to at least one example embodiment.
FIG. 2 is a cross-sectional view along line II-II of the e-vaping device of FIG. 1 according to at least one example embodiment.

Some detailed example embodiments are disclosed herein. However, specific structural and functional details disclosed herein are merely representative for purposes of describing example embodiments. Example embodiments may, however, be embodied in many alternate forms and should not be construed as limited to only the example embodiments set forth herein.

Accordingly, while example embodiments are capable of various modifications and alternative forms, example embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various example embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a side view of an e-vaping device according to at least one example embodiment.

In at least one example embodiment, as shown in FIG. 1, an electronic vaping device (e-vaping device) 60 may include a replaceable cartridge (or first section) 70 and a reusable battery section (or second section) 72, which may be coupled together at a threaded connector 205. It should be appreciated that the connector 205 may be any type of connector, such as a snug-fit, detent, clamp, bayonet, and/or clasp.

In at least one example embodiment, the connector 205 may be the connector described in U.S. application Ser. No. 15/154,439, filed May 13, 2016, the entire contents of which is incorporated herein by reference thereto. As described in U.S. application Ser. No. 15/154,439, the connector 205 may be formed by a deep drawn process.

In at least one example embodiment, the first section 70 may include a housing 6 and the second section 72 may include a second housing 6'. The e-vaping device 60 includes a mouth-end insert 8.

In at least one example embodiment, the housing 6 and the second housing 6' may have a generally cylindrical cross-section. In other example embodiments, the housings 6 and 6' may have a generally triangular cross-section along one or more of the first section 70 and the second section 72. Furthermore, the housings 6 and 6' may have the same or different cross-section shape, or the same or different size. As discussed herein, the housings 6 and 6' may also be referred to as outer or main housings.

In at least one example embodiment, the e-vaping device 60 may include a conductive contact assembly 300 including a first contact 310 (shown in FIGS. 2-3 and 5-6), a second contact 320, and an end cap housing 340, which are described in more detail below. Each of the first contact 310 and the second contact 320 may be used in charging the power supply of the e-vaping device. The first contact 310, the second contact 320, and the end cap housing 340 are described in more detail below.

As discussed in more detail later, the first contact 310 and/or the second contact 320 may be utilized in charging the power supply of the e-vaping device as well as for inputting touch commands. Accordingly, the conductive contact assembly 300 may be configured to be used to charge the power supply of the e-vaping device and to input touch commands to control the e-vaping device.

FIG. 2 is a cross-sectional view along line II-II of the e-vaping device of FIG. 1.

In at least one example embodiment, as shown in FIG. 2, the first section 70 may include a reservoir 22 configured to store a pre-vapor formulation and a heater 14 that may vaporize the pre-vapor formulation, which may be drawn from the reservoir 22 by a wick 28. The e-vaping device 60 may include the features set forth in U.S. Patent Application Publication No. 2013/0192623 to Tucker et al. filed Jan. 31, 2013, the entire contents of which is incorporated herein by reference thereto. In other example embodiments, the e-vaping device may include the features set forth in U.S. patent application Ser. No. 15/135,930 filed Apr. 22, 2016, U.S. patent application Ser. No. 15/135,923 filed Apr. 22, 2016, and/or U.S. Pat. No. 9,289,014 issued Mar. 22, 2016, the entire contents of each of which is incorporated herein by this reference thereto.

In at least one example embodiment, the pre-vapor formulation is a material or combination of materials that may be transformed into a vapor. For example, the pre-vapor formulation may be a liquid, solid and/or gel formulation including, but not limited to, water, beads, solvents, active ingredients, ethanol, plant extracts, natural or artificial flavors, and/or vapor formers such as glycerin and propylene glycol.

In at least one example embodiment, the first section 70 may include the housing 6 extending in a longitudinal direction and an inner tube (or chimney) 62 coaxially positioned within the housing 6.

At an upstream end portion of the inner tube 62, a nose portion 61 of a gasket (or seal) 15 may be fitted into the inner tube 62; and an outer perimeter of the gasket 15 may provide a seal with an interior surface of the housing 6. The gasket 15 may also include a central, longitudinal air passage 20 in fluid communication with the inner tube 62 to define an inner passage (also referred to as a central channel or central inner passage) 21. A transverse channel 33 at a backside portion of the gasket 15 may intersect and communicate with the air passage 20 of the gasket 15. This transverse channel 33 assures communication between the air passage 20 and a space 35 defined between the gasket 15 and a first connector piece 37.

In at least one example embodiment, the first connector piece 37 may include a male threaded section for effecting the connection between the first section 70 and the second section 72.

In at least one example embodiment, more than two air inlet ports 44 may be included in the housing 6. Alternatively, a single air inlet port 44 may be included in the housing 6. Such arrangement allows for placement of the air inlet ports 44 close to the connector 205 without occlusion by the presence of the first connector piece 37. This arrangement may also reinforce the area of air inlet ports 44 to facilitate precise drilling of the air inlet ports 44.

In at least one example embodiments, the air inlet ports 44 may be provided in the connector 205 instead of in the housing 6. In other example embodiments, the connector 205 may not include threaded portions.

In at least one example embodiment, the at least one air inlet port 44 may be formed in the housing 6, adjacent the connector 205 to minimize the chance of an adult vaper's fingers occluding one of the ports and to control the resistance-to-draw (RTD) during vaping. In at least one example embodiment, the air inlet ports 44 may be machined into the housing 6 with precision tooling such that their diameters are closely controlled and replicated from one e-vaping device 60 to the next during manufacture.

In at least one example embodiment, the air inlet ports 44 may be sized and configured such that the e-vaping device 60 has a resistance-to-draw (RTD) in the range of from about 60 mm $H_2O$ to about 150 mm $H_2O$.

In at least one example embodiment, a nose portion 93 of a second gasket 10 may be fitted into a first end portion 81 of the inner tube 62. An outer perimeter of the second gasket 10 may provide a substantially tight seal with an interior surface 97 of the housing 6. The second gasket 10 may include a central channel 63 disposed between the inner passage 21 of the inner tube 62 and the interior of the mouth-end insert 8, which may transport the vapor from the inner passage 21 to the mouth-end insert 8. The mouth-end insert 8 includes at least two outlets, which may be located off-axis from the longitudinal axis of the e-vaping device 60. The outlets may be angled outwardly in relation to the longitudinal axis of the e-vaping device 60. The outlets may be substantially uniformly distributed about the perimeter of the mouth-end insert 8 so as to substantially uniformly distribute vapor in an adult vaper's mouth during vaping and create a greater perception of fullness in the mouth. Thus, as the vapor passes into the adult vaper's mouth, the vapor may enter the mouth and may move in different directions so as to provide a full mouth feel.

In at least one example embodiment, the space defined between the gaskets 10 and 15 and the housing 6 and the inner tube 62 may establish the confines of a reservoir 22. The reservoir 22 may contain a pre-vapor formulation, and optionally a storage medium (not shown) configured to store the pre-vapor formulation therein. The storage medium may include a winding of cotton gauze or other fibrous material about the inner tube 62.

In at least one example embodiment, the reservoir 22 may be contained in an outer annulus between the inner tube 62 and the housing 6 and between the gaskets 10 and 15. Thus, the reservoir 22 may at least partially surround the inner passage 21. The heater 14 may extend transversely across the inner passage 21 between opposing portions of the reservoir 22. In some example embodiments, the heater 14 may extend parallel to a longitudinal axis of the inner passage 21.

In at least one example embodiment, the reservoir 22 may be sized and configured to hold enough pre-vapor formulation such that the e-vaping device 60 may be configured for vaping for at least about 200 seconds. Moreover, the e-vaping device 60 may be configured to allow each puff to last a maximum of about 5 seconds.

In at least one example embodiment, the storage medium may be a fibrous material including at least one of cotton, polyethylene, polyester, rayon and combinations thereof. The fibers may have a diameter ranging in size from about 6 microns to about 15 microns (e.g., about 8 microns to about 12 microns or about 9 microns to about 11 microns). The storage medium may be a sintered, porous or foamed material. Also, the fibers may be sized to be irrespirable and may have a cross-section which has a Y-shape, cross shape, clover shape or any other suitable shape. In at least one example embodiment, the reservoir 22 may include a filled tank lacking any storage medium and containing only pre-vapor formulation.

During vaping, pre-vapor formulation may be transferred from the reservoir 22 and/or storage medium to the proximity of the heater 14 via capillary action of the wick 28. The wick 28 may include at least a first end portion and a second end portion, which may extend into opposite sides of the reservoir 22. The heater 14 may at least partially surround a central portion of the wick 28 such that when the heater 14 is activated, the pre-vapor formulation in the central portion of the wick 28 may be vaporized by the heater 14 to form a vapor.

In at least one example embodiment, the wick 28 may include filaments (or threads) having a capacity to draw the pre-vapor formulation. For example, the wick 28 may be a bundle of glass (or ceramic) filaments, a bundle including a group of windings of glass filaments, etc., all of which arrangements may be capable of drawing pre-vapor formulation via capillary action by interstitial spacings between the filaments. The filaments may be generally aligned in a direction perpendicular (transverse) to the longitudinal direction of the e-vaping device 60. In at least one example embodiment, the wick 28 may include one to eight filament strands, each strand comprising a plurality of glass filaments twisted together. The end portions of the wick 28 may be flexible and foldable into the confines of the reservoir 22. The filaments may have a cross-section that is generally cross-shaped, clover-shaped, Y-shaped, or in any other suitable shape.

In at least one example embodiment, the wick 28 may include any suitable material or combination of materials. Examples of suitable materials may be, but not limited to, glass, ceramic- or graphite-based materials. The wick 28 may have any suitable capillarity drawing action to accommodate pre-vapor formulations having different physical properties such as density, viscosity, surface tension and vapor pressure. The wick 28 may be non-conductive.

In at least one example embodiment, the heater 14 may include a wire coil which at least partially surrounds the wick 28. The wire may be a metal wire and/or the heater coil may extend fully or partially along the length of the wick 28. The heater coil may further extend fully or partially around the circumference of the wick 28. In some example embodiments, the heater 14 may or may not be in contact with the wick 28.

In at least one example embodiment, the heater coil may be formed of any suitable electrically resistive materials. Examples of suitable electrically resistive materials may include, but not limited to, copper, titanium, zirconium, tantalum and metals from the platinum group. Examples of suitable metal alloys include, but not limited to, stainless steel, nickel, cobalt, chromium, aluminum-titanium-zirconium, hafnium, niobium, molybdenum, tantalum, tungsten, tin, gallium, manganese and iron-containing alloys, and super-alloys based on nickel, iron, cobalt, stainless steel. For example, the heater 14 may be formed of nickel aluminide, a material with a layer of alumina on the surface, iron aluminide and other composite materials, the electrically resistive material may optionally be embedded in, encapsulated or coated with an insulating material or vice-versa, depending on the kinetics of energy transfer and the external physicochemical properties required. The heater 14 may include at least one material selected from the group consisting of stainless steel, copper, copper alloys, nickel-chromium alloys, super alloys and combinations thereof. In an example embodiment, the heater 14 may be formed of nickel-chromium alloys or iron-chromium alloys. In another example embodiment, the heater 14 may be a ceramic heater having an electrically resistive layer on an outside surface thereof.

The inner tube 62 may include a pair of opposing slots, such that the wick 28 and the first and second electrical leads 109 and 109' or ends of the heater 14 may extend out from the respective opposing slots. The provision of the opposing slots in the inner tube 62 may facilitate placement of the heater 14 and wick 28 into position within the inner tube 62 without impacting edges of the slots and the coiled section of the heater 14. Accordingly, edges of the slots may not be allowed to impact and alter the coil spacing of the heater 14, which would otherwise create potential sources of hotspots. In at least one example embodiment, the inner tube 62 may have a diameter of about 4 mm and each of the opposing slots may have major and minor dimensions of about 2 mm by about 4 mm.

The first lead 109 is physically and electrically connected to the male threaded connector piece 37. As shown, the male threaded first connector piece 37 is a hollow cylinder with male threads on a portion of the outer later surface. The connector piece is conductive, and may be formed or coated with a conductive material. The second lead 109' is physically and electrically connected to a first conductive post 110. The first conductive post 110 may be formed of a conductive material (e.g., stainless steel, copper, etc.), and may have a T-shaped cross-section as shown in FIG. 2. The first conductive post 110 nests within the hollow portion of the first connector piece 37, and is electrically insulated from the first connector piece 37 by an insulating shell 111. The first conductive post 110 may be hollow as shown, and the hollow portion may be in fluid communication with the air passage 20. Accordingly, the first connector piece 37 and the first conductive post 110 form respective external electrical connection to the heater 14.

In at least one example embodiment, the heater 14 may heat pre-vapor formulation in the wick 28 by thermal conduction. Alternatively, heat from the heater 14 may be conducted to the pre-vapor formulation by means of a heat conductive element or the heater 14 may transfer heat to the incoming ambient air that is drawn through the e-vaping device 60 during vaping, which in turn heats the pre-vapor formulation by convection.

It should be appreciated that, instead of using a wick 28, the heater 14 may include a porous material which incorporates a resistance heater formed of a material having a high electrical resistance capable of generating heat quickly.

As shown in FIG. 2, the second section 72 includes a power supply 1, a control circuit 200, sensor 16, and conductive contact assembly (also referred to as a contact assembly or connector assembly) 300. As shown, the control circuit 200 and sensor 16 are disposed in the housing 6'. The contact assembly 300 forms one end of the second section 72, and a female threaded second connector piece 112 forms a second end. As shown, the second connector piece 112 has a hollow cylinder shape with threading on an inner later surface. The inner diameter of the second connector piece 112 matches that of the outer diameter of the first connector pieces 37 such that the two connector pieces 37 and 112 may be threaded together to form a connection 205. Furthermore, the second connector piece 112, or at least the other later surface is conductive, for example, formed of or including a conductive material. As such, an electrical and physical connection occurs between the first and second connector pieces 37 and 112 when connected.

As shown, a first lead 720 electrically connects the second connector piece 112 to the control circuit 200. A second lead 730 electrically connects the control circuit 200 to a first terminal 113 of the power supply 1. A third lead 725 electrically connects a second terminal 114 of the power supply 1 to the power terminal of the control circuit 200 to provide power to the control circuit 200. The second terminal 114 of the power supply 1 is also physically and electrically connected to a second conductive post 115. The second conductive post 115 may be formed of a conductive material (e.g., stainless steel, copper, etc.), and may have a T-shaped cross-section as shown in FIG. 2. The second conductive post 115 nests within the hollow portion of the second connector piece 112, and is electrically insulated from the second connector piece 112 by an insulating shell 116. The second conductive post 115 may also be hollow as shown. When the first and second connector pieces 37 and 112 are mated, the second conductive post 115 physically and electrically connects to the first conductive post 110. Also, the hollow portion of the second conductive post 115 may be in fluid communication with the hollow portion of the first conductive post 110.

While the first section 70 has been shown and described as having the male connector piece and the second section 72 has been shown and described as having the female connector piece, an alternative embodiment includes the opposite where the first section 70 has the female connector piece and the second section 72 has the male connector piece.

In at least one example embodiment, the power supply 1 includes a battery arranged in the e-vaping device 60. The power supply 1 may be a Lithium-ion battery or one of its variants, for example a Lithium-ion polymer battery. Alternatively, the power supply 1 may be a nickel-metal hydride battery, a nickel cadmium battery, a lithium-manganese battery, a lithium-cobalt battery or a fuel cell. The e-vaping device 60 may be vapable by an adult vaper until the energy in the power supply 1 is depleted or in the case of lithium polymer battery, a minimum voltage cut-off level is achieved.

In at least one example embodiment, the power supply 1 is rechargeable. The second section 72 may include circuitry configured to allow the battery to be chargeable by an external charging device. To recharge the e-vaping device 60, an USB charger or other suitable charger assembly may be used as described below.

In at least one example embodiment, the sensor 16 is configured to generate an output indicative of a magnitude and direction of airflow in the e-vaping device 60. The control circuit 200 receives the output of the sensor 16, and determines if (1) the direction of the airflow indicates a draw on the mouth-end insert 8 (versus blowing) and (2) the magnitude of the draw exceeds a threshold level. If these vaping conditions are met, the control circuit 200 electrically connects the power supply 1 to the heater 14; thus, activating the heater 14. Namely, the control circuit 200 electrically connects the first and second leads 720 and 730 (e.g., by activating a heater power control circuit 945 as discussed below with regard to FIG. 6) such that the heater 14 becomes electrically connected to the battery 1. In an alternative embodiment, the sensor 16 may indicate a pressure drop, and the control circuit 200 activates the heater 14 in response thereto.

In at least one example embodiment, the control circuit 200 may also include a light 48, which the control circuit 200 activates to glow when the heater 14 is activated and/or the battery is recharged. The light 48 may include one or more light-emitting diodes (LEDs). The LEDs may include one or more colors (e.g., white, yellow, red, green, blue, etc.). Moreover, the light 48 may be arranged to be visible to an adult vaper during vaping, and may be positioned between a first end 210 and a second end 220 of the e-vaping device 60. In addition, the light 48 may be utilized for e-vaping system diagnostics or to indicate that recharging is in progress. The light 48 may also be configured such that the adult vaper may activate and/or deactivate the heater activation light 48 for privacy.

In at least one example embodiment, the control circuit 200 may include a time-period limiter. In another example embodiment, the control circuit 200 may include a manually operable switch for an adult vaper to initiate heating. The time-period of the electric current supply to the heater 14 may be set or pre-set depending on the amount of pre-vapor formulation desired to be vaporized. In yet another example embodiment, the sensor 16 may detect a pressure drop and the control circuit 200 may supply power to the heater 14 as long as heater activation conditions are met.

Next, operation of the e-vaping device to create a vapor will be described. For example, air is drawn primarily into the first section 70 through the at least one air inlet 44 in response to a draw on the mouth-end insert 8. The air passes through the air inlet 50, into the transverse channel 33 at the backside portion of the gasket 15 and into the air passage 20 of the gasket 15, into the inner passage 21, and through the outlet 24 of the mouth-end insert 8. If the control circuit 200 detects the vaping conditions discussed above, the control circuit 200 initiates power supply to the heater 14, such that the heater 14 heats pre-vapor formulation in the wick 28 to form a vapor. The vapor and air flowing through the inner passage 21 combine and exit the e-vaping device 60 via the outlet 24 of the mouth-end insert 8.

When activated, the heater 14 may heat a portion of the wick 28 surrounded by the heater for less than about 10 seconds.

In at least one example embodiment, the first section 70 may be replaceable. In other words, once the pre-vapor formulation of the cartridge is depleted, only the first section 70 may be replaced. An alternate arrangement may include an example embodiment where the entire e-vaping device 60 may be disposed once the reservoir 22 is depleted. In at least one example embodiment, the e-vaping device 60 may be a one-piece e-vaping device.

In at least one example embodiment, the e-vaping device 60 may be about 80 mm to about 110 mm long and about 7 mm to about 8 mm in diameter. For example, in one example embodiment, the e-vaping device may be about 84 mm long and may have a diameter of about 7.8 mm.

In at least one example embodiment, as shown in FIG. 2, the e-vaping device 60 includes the contact assembly 300 as described in greater detail below with reference to FIGS. 4-5.

Figure 3A:
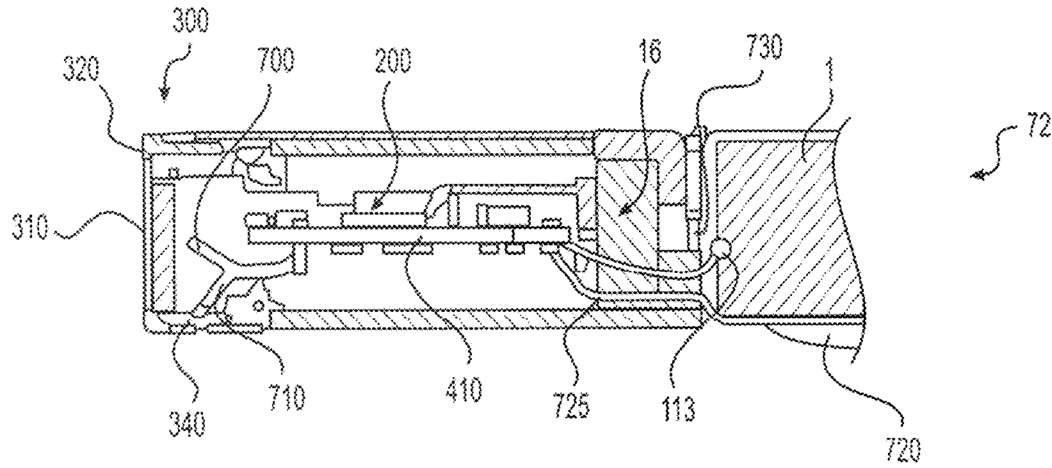
FIG. 3A is an enlarged view of an end of the battery section of an e-vaping device according to at least one example embodiment.

FIG. 3A is an enlarged view of an end of the second (or battery) section of an e-vaping device according to at least one example embodiment.

In at least one example embodiment, as shown in FIG. 3A, the second section 72 is the same as in FIG. 2. The control circuit 200 is disposed on a rigid printed circuit board 410. The circuit board 410 is connected to the first contact 310 via lead 700. The circuit board 410 is connected to the second contact 320 via lead 710.

Figure 3B:
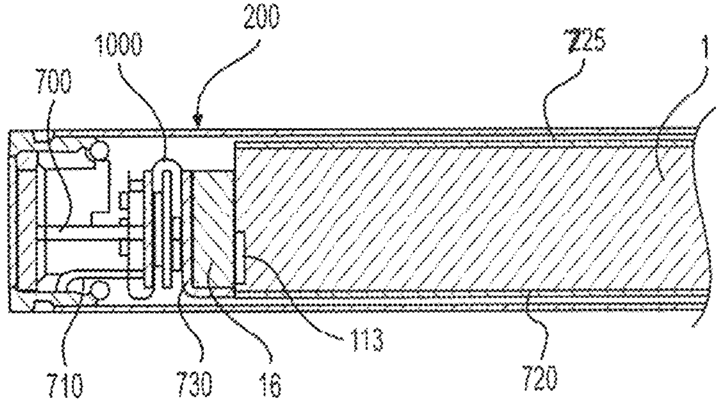
FIG. 3B is an enlarged view of an end of a battery section of an e-vaping device according to at least one example embodiment.

FIG. 3B is an enlarged view of an end of the second section of an e-vaping device according to at least one example embodiment.

In at least one example embodiment, as shown in FIG. 3B, the second section 72 is the same as in FIG. 2. The control circuit 200 is disposed on a flexible printed circuit board 1000. The flexible printed circuit board 1000 allows for the inclusion of a larger battery 1 since the flexible printed circuit board 1000 requires less space within the housing 6' than the rigid circuit board 410 of FIG. 3A.

Figure 4:
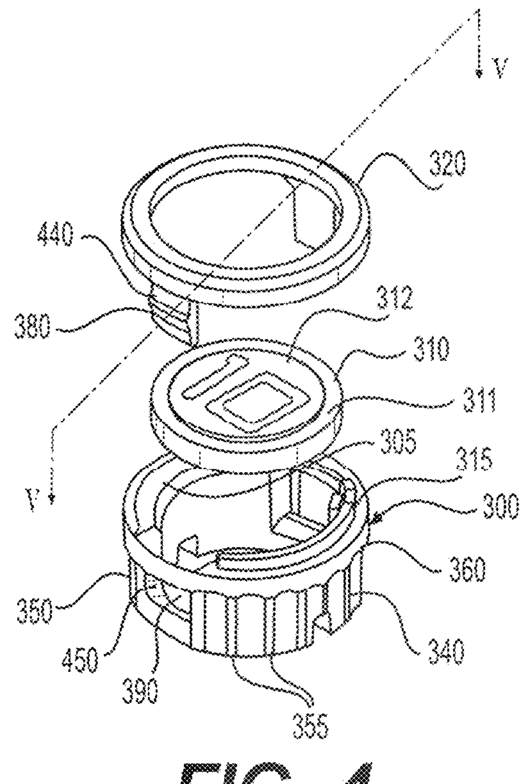
FIG. 4 is an exploded view of the conductive contact assembly of FIG. 2 according to at least one example embodiment.

FIG. 4 is an exploded view of the conductive contact assembly of FIG. 2 according to at least one example embodiment. FIG. 5 is a cross-sectional view of an assembled (or non-exploded) version of the conductive contact assembly of FIG. 4 along line V-V of FIG. 4 according to at least one example embodiment.

Figure 5:
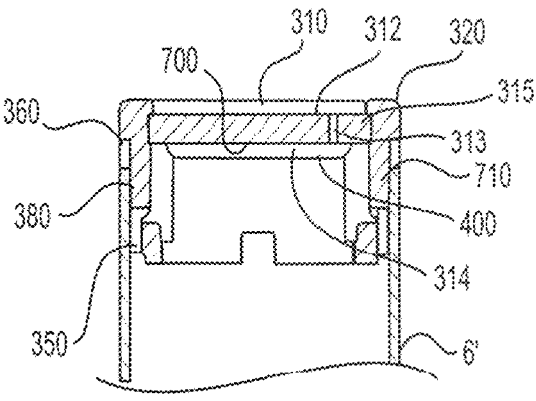
FIG. 5 is a cross-sectional view of the conductive contact assembly of FIG. 2 according to at least one example embodiment.

As shown in FIGS. 4 and 5, the contact assembly 300 is the same as shown in FIG. 2, and is shown in greater detail. As shown in FIG. 4, the contact assembly 300 includes the first contact 310, the second contact 320, and the end cap housing 340.

The first contact 310 has a disk shape. In at least one example embodiment, the first contact 310 may be formed of a printed circuit board (PCB), which may be rigid or flexible. The first contact 310 includes a substrate 315 with a first conductive portion 312 formed on an upper surface thereof and a second conductive portion 314 formed on a bottom surface thereof. At least one conductive via 313 electrically connects the first and second conductive portions 312 and 314 (see FIG. 5). The first conductive portion 312 and the second conductive portion 314 may be copper, stainless steel, magnetic stainless steel, etc. The first conductive portion 312 may have a generally circular shape, and/or form a pattern. For example, the conductive portion 312 forms the outline of the number "10" in the example of FIG. 4. The first conductive portion 312 has an area such that the second contact 320 does not overlap the first conductive portion 312, and the first conductive portion 312 of the first contact 310 is electrically insulated from the second contact 320. Instead, a non-conductive portion 311 of the substrate

315 is exposed, and the second contact 320 overlaps and/or contacts the non-conductive portion 311.

As shown, the end cap housing 340 has a generally, hollow cylindrical shape defined by a sidewall 350. A lower portion of the sidewall 350 includes ridges 355, and an upper portion includes a flange 360. In at least one example embodiment, the flange 360 has an outer diameter that is about the same as the outer diameter of the housing 6'. The sidewall 350 has an outer diameter that is slightly less than an inner diameter of the housing 6' so that the sidewall 350 may be held in place in the housing 6' by friction fit. The sidewall 350 may include the ridges 355 to aid in holding the end cap housing 340 within the housing 6'.

In at least one example embodiment, the end cap housing 340 includes a ridge or inner ledge 305 projecting from the inner later surface. The first contact 310 rests on the inner ledge 305. Two projecting fins 315 project from an end of the end cap housing 340. The projecting fins 315 separate the inner ledge 305 from the flange 360. The second contact 320 rests on an outer ledge of the flange 360. While two projecting fins 315, each extending at least 90 degrees around the end of the end cap housing 340 are shown, it will be understood the more or less than two projecting fins 315 may be formed.

As stated above, a portion of the second contact 320 mates with the flange 360 of the end cap housing 340, and in doing so, tabs 380 of the second contact 320 fit in slots 390 in the sidewall 350 of the end cap housing 340 so as to secure the second contact 320 with the end cap housing 340, and hold the first contact 310 in place against the inner ledge 305. As shown in FIG. 5, the lead 700 is connected to the second conductive portion 314 and the lead 710 is connected to at least one of the tabs 380.

In at least one example embodiment, the end cap housing 340 may be formed of plastic. At least a portion of the flange 360 of the end cap housing 340 may be transparent so that light from the heater activation light 48 may be seen through the flange 360. The first contact 310 and the second contact 320 may be opaque (e.g., may include a solder mask to substantially prevent light from being seen through the PCB), such that the light 48 may not be seen through the end of the e-vaping device 60.

As shown in FIG. 4, stops 440 are disposed on the tabs 380, and the stops latch beneath a portion 450 of the flange 360 when the tabs 380 are mated with the slots 390. The tabs 380 may be resilient such that the tabs 380 bend slightly when being inserted into the slots 390, but spring back into an original position to lock the tabs 380 within the slots 390.

The second contact 320 is conductive, and conductive portions of the first contact 310 are electrically isolated from the second contact 320 as described above. Also, in at least one example embodiment, the first contact 310 and the second contact 320 are magnetic. Accordingly, the tabs 380 and the slots 390 are configured to lock together so as to prevent magnetic attraction from removing the first contact 310 and the second contact 320 from the e-vaping device 60.

In at least one alternative embodiment, at least a portion of the first contact 310 may be substantially transparent such that the light 48 shines through a side portion of the end cap housing 340.

Figure 6:
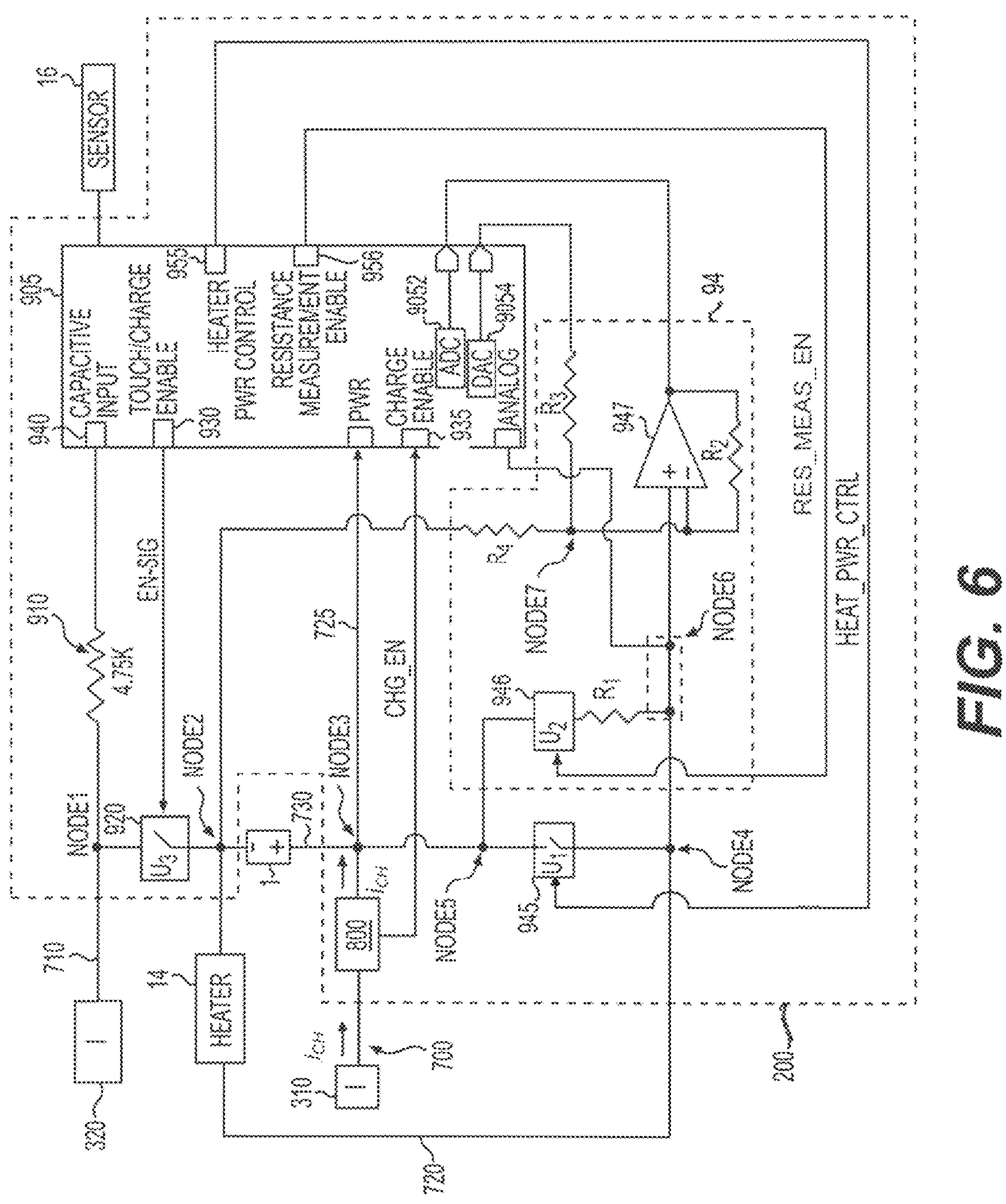
FIG. 6 is a circuit diagram illustrating an example embodiment of a control circuit of the e-vaping device shown in FIG. 1.

FIG. 6 is a circuit diagram illustrating an example embodiment of the control circuit 200 of the e-vaping device shown in FIG. 1. The control circuit 200 shown in FIG. 6 is described with regard to a situation in which the first section 70 is connected to the second section 72 as discussed above. Thus, both the heater 14 and the power supply 1 are shown in FIG. 6.

As shown in FIG. 6, the control circuit 200 includes a microcontroller 905, a charge controller 800, a mode control switch circuit 920, a heater power control circuit 945, a resistance measurement circuit 94 and a resistor 910. In this example, the mode control switch circuit 920 includes a mode control switch U3, and the heater power control circuit 945 includes a heater power control switch U1. The microcontroller 905 includes an analog-to-digital converter (ADC) 9052 and a digital-to-analog converter (DAC) 9054. The ADC 9052 may be a 10-bit ADC and the DAC 9054 may be an 8-bit DAC. However, example embodiments should not be limited to these examples.

The resistance measurement circuit 94 includes a first resistor R1, a second resistor R2, a third resistor R3, a fourth resistor R4, an operational amplifier (OP-AMP) 947 and a resistance measurement switch circuit 946. The resistance measurement switch circuit 946 includes a resistance measurement switch U2. The OP-AMP 947 may be a differential operational amplifier.

Each of the heater power control switch U1, the resistance measurement switch U2 and the mode control switch U3 may be transistors (e.g., NMOS or MOSFET transistors), although example embodiments should not be limited to these examples. For example purposes, the switches U1 through U3 will be described herein as transistors. In this regard, the heater power control switch U1 may be referred to as a heater power control transistor U1, the resistance measurement switch U2 may be referred to as a resistance measurement transistor U2, and the mode control switch U3 may be referred to as mode control transistor U3. Again, however, example embodiments should not be limited to these examples.

Referring to FIG. 6, a capacitive input 940 of the microcontroller 905 is connected to a first terminal of the resistor 910. A second terminal of the resistor 910 is connected to the second contact 320 via the lead 710.

A first terminal of the mode control transistor U3 is connected to a first node NODE1 between the second terminal of the resistor 910 and the second contact 320. A second terminal of the mode control switch U3 is connected to the negative terminal of the power supply 1, a first end of the heater 14 and a first terminal of the fifth resistor R4 of the resistance measurement circuit 94 at second node NODE2. A gate of the mode control transistor U3 is connected to a touch/charge enable terminal 930 (also referred to herein as an enable terminal) at the microcontroller 905. As discussed herein, the negative terminal of the power supply 1 may also be referred to as common ground, ground, ground plane or common ground plane.

The charge controller 800 is electrically connected between the first contact 310 (via the lead 700) and the charge enable terminal 935 of the microcontroller 905. The charge controller 800 is also electrically connected to the positive terminal of the power supply 1 at a third node NODE3. The positive terminal of the power supply 1 is connected to the control circuit 200 via lead 703, and also connected to the power input terminal PWR of the microcontroller 905 via the lead 725 to provide power to the control circuit 200 and the microcontroller 905.

According to at least one example embodiment, the charge controller 800 may be any known charge controller. In one example, the charge controller 800 may include a linear regulator. According to at least one example embodiment, the charge controller 800 may be configured to determine a level of charge of the power supply 1, and to control application of charging current $i_{CH}$ and/or voltage to the power supply 1 based on the determined level of charge.

The charge controller 800 may also detect input of a charging current $i_{CH}$ via the first contact 310 and the lead 700, and output a charge enable signal CHG_EN based on the detected charging current $i_{CH}$. In at least one example embodiment, the charge enable signal CHG_EN may be disabled (e.g., have a first logic value, such as a logic low) when no charging current is detected, and may be enabled (e.g., have a second logic value, such as a logic high level) when the charging current is detected. In another example, the charge enable signal CHG_EN may be described as being output when the charging current is detected, and not output when no charging current is detected. The charge controller 800 may also output regulated charging current $i_{CH}$ to the positive terminal of the power supply 1 to charge the power supply 1. Because charge controllers such as this are well-known, a more detailed discussion is omitted.

Still referring to FIG. 6, a first terminal of the heater power control transistor U1 is connected to the positive terminal of the power supply 1 and a second terminal of the heater power control transistor U1 is connected to a second end of the heater 14 at a fourth node NODE4 via the first lead 720 between the heater 14 and the control circuit 200. A gate of the heater power control transistor U1 is electrically connected to a heater power control terminal 955 of the microcontroller 905. According to at least this example embodiment, the microcontroller 905 outputs a heater power control signal HEAT_PWR_CTRL to control the heater power control transistor U1 to regulate and control power from the power supply 1 to the heater 14.

The resistance measurement circuit 94 is electrically connected to the first terminal of the heater power control transistor U1, the positive terminal of the power supply 1 and the charge controller 800 at a fifth node NODE5, via node NODE3. The resistance measurement circuit 94 is also electrically connected to the ADC 9052, the DAC 9054 and a resistance measurement enable terminal 956 at the microcontroller 905.

Within the resistance measurement circuit 94, a first terminal of the resistance measurement transistor 946 is connected to the first terminal of the heater power control transistor U1, the positive terminal of the power supply 1 and the charge controller 800 at the fifth node NODE5. A second terminal of the resistance measurement transistor 946 is connected to a first terminal of first resistor R1. The gate of the resistance measurement transistor 946 is connected to the resistance measurement enable terminal 956 at the microcontroller 905.

The second terminal of the first resistor R1 is connected to a positive input of the operational amplifier (OP-AMP) 947, the second terminal of the heater power control transistor U1, the second end of the heater 14 and an analog input ANALOG of the microcontroller 905 at a sixth node NODE6.

The output terminal of the OP-AMP 947 is connected to the ADC 9052 at the microcontroller 905. The second resistor R2 is connected in parallel between the negative input terminal and the output terminal of the OP-AMP 947. The negative input terminal of the OP-AMP 947 is also connected to a first terminal of the third resistor R3 and a second terminal of the fourth resistor R4.

The second terminal of the third resistor R3 is connected to the DAC 9054 at the microcontroller 905.

Still referring to FIG. 6, the microcontroller 905 is also electrically connected to the sensor 16.

Although the example embodiment shown in FIG. 6 is discussed with regard the resistance measurement circuit 94 being separate from the microcontroller 905, example embodiments should not be limited to this example. Rather, according to one or more other example embodiments, the resistance measurement circuit 94, or one or more components thereof (e.g., the OP-AMP 947), may be included and implemented in the microcontroller 905.

Example operation of the control circuit 200 shown in FIG. 6 will now be described.

According to at least one example embodiment, when the first section 70 is connected to the second section 72, the mode control transistor U3 is initially set to the ON state. In this example, the mode control transistor U3 transitions from the ON state to the OFF state periodically based on a monitoring frequency for the control circuit 200 in response to switching of a charge monitoring signal EN_SIG from the microcontroller 905 via the enable terminal 930 (also referred to herein as an enable terminal). The monitoring frequency is discussed in more detail later.

According to at least some example embodiments, each time the mode control transistor U3 transitions from the ON state to the OFF state the control circuit 200 monitors for a touch event for a relatively short interval (sometimes referred to as a touch detection interval). This relatively short interval may occur at the beginning of what may be referred to as a "wake" cycle based on the sleep state of the microcontroller, after which the control circuit 200 may return to a state in which charging of power supply 1 may be initiated.

As discussed herein, switching of the charge monitoring signal EN_SIG may refer to transitioning of the signal from the logic high to the logic low level. As discussed herein, switching of the charge monitoring signal EN_SIG to the logic low level may also be referred to as disabling or disabling output of the charge monitoring signal EN_SIG. However, example embodiments should not be limited to this example.

As discussed herein, the ON state of the mode control transistor 920 may also be referred to as an active state, or as the mode control transistor 920 being activated. Similarly, the OFF state may also be referred to as an inactive state or as the mode control transistor 920 being deactivated.

According to one or more example embodiments, the microcontroller 905 and/or the control circuit 200 may operate in one of a monitoring mode, a touch command mode and a charging mode. Example operation of the control circuit 200 in each of these operating modes will be discussed in more detail below.

In the monitoring mode, the charging enable signal CHG_EN is disabled, and the mode control transistor U3 is periodically deactivated in response to disabling of the charge monitoring signal EN_SIG from the enable terminal 930 of the microcontroller 905. Disabling of the charge monitoring signal EN_SIG may also be characterized as enabling a touch monitoring signal.

The frequency of the charge monitoring signal EN_SIG, and consequently the periodicity of the deactivation of the mode control transistor U3, is based on a state of the microcontroller 905 in the monitoring mode. In one example, the monitoring mode may include a plurality of states. In each of the plurality of states, the charge monitoring signal EN_SIG may have a different frequency, and thus, the deactivation of the mode control transistor U3 may have a different periodicity. In one example, the monitoring mode may include an active state, a standby state and a hibernate state.

In an example of the active state, the charge monitoring signal EN_SIG may have a frequency of about 100 Hz, such that the mode control transistor U3 is deactivated (transitions to the OFF state) about every 0.01 seconds.

In an example of the standby state, the charge monitoring signal EN_SIG may have a frequency of about 50 Hz, such that the mode control transistor U3 is deactivated about every 0.05 seconds.

In an example of the hibernate state, the charge monitoring signal EN_SIG may have a frequency of about 10 Hz such that the mode control transistor U3 is deactivated about every 0.10 seconds.

When a cartridge including a heater element (e.g., first section 70) is attached to the battery section (e.g., second section 72), the microcontroller 905 detects that the cartridge is attached to the battery section and defaults to the active state. As is generally well-known, the microcontroller 905 may detect attachment of a cartridge to the battery section based on a change in resistance (e.g., from essentially infinite resistance to a finite resistance value) resulting from attachment of the cartridge.

If a cartridge is attached and no puff event is detected by the sensor 16 within a first threshold interval (e.g., about 20 seconds) from the time the cartridge was attached, then the microcontroller 905 transitions to the standby state. While in the standby state, if no puff event is detected by the sensor 16 within a second threshold time period (e.g., 40 seconds) from attachment of the cartridge (or, alternatively, another interval of 20 seconds from the time at which the microcontroller 905 transitioned to the standby state), then the microcontroller 905 transitions to the hibernate state. The microcontroller stays in the hibernate state until a puff event is detected by the sensor 16. If the sensor 16 detects a puff event in the standby or hibernate states, the microcontroller 905 transitions to the active state to increase responsiveness to an adult vaper. When no cartridge is attached, the microcontroller 905 remains in the hibernate state until a cartridge is attached. As discussed above, when the cartridge is attached, the microcontroller 905 transitions to the active state.

Figure 14:
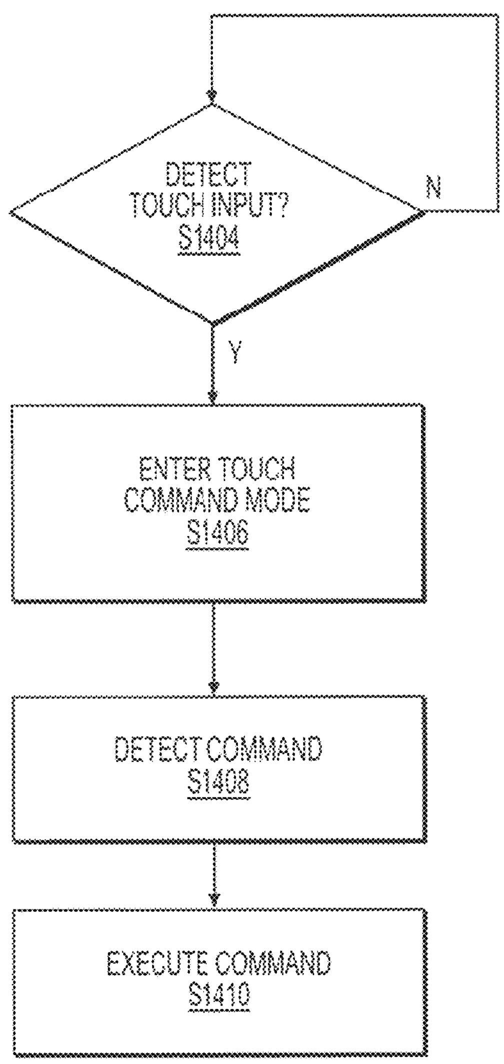
FIG. 14 is a flow chart illustrating an example embodiment of a method of operating the control circuit shown in FIG. 6.

FIG. 14 is a flow chart illustrating an example embodiment of a method of operating the control circuit 200 shown in FIG. 6. The example embodiment shown in FIG. 14 will be discussed with regard to the microcontroller 905 initially operating in the monitoring mode with the mode control transistor 920 in the ON state. However, example embodiments should not be limited to this example.

As discussed above, in the monitoring mode, the mode control transistor U3 is periodically deactivated by disabling the charge monitoring signal EN_SIG output from the enable terminal 930 of the microcontroller 905. The method shown in FIG. 14 may be performed periodically when the mode control transistor 920 is deactivated. In this regard, the method shown in FIG. 14 may be performed according to the frequency of the charge monitoring signal EN_SIG.

Referring to FIG. 14, when the mode control transistor U3 is deactivated in response to the disabling of the charge monitoring signal EN_SIG by the microcontroller 905, at step S1404 the microcontroller 905 detects whether a touch has been input by an adult vaper.

With regard to step S1404, in one example, when the mode control transistor U3 is in the OFF state, and the adult vaper touches the second contact 320, the part of the adult vaper (e.g., the finger) touching the second contact 320 and the second contact 320 itself act as terminals of a capacitor, which changes the measured capacitance along the circuit path between the second contact 320 and the capacitive input 940. When the microcontroller 905 detects this change in capacitance, the microcontroller 905 determines that the adult vaper has touched the second contact 320, thereby detecting a touch input by the adult vaper.

If the microcontroller 905 does not detect a touch input by an adult vaper at step S1404, then the microcontroller 905 remains in the monitoring mode and operates as discussed above.

Still referring to step S1404, if the microcontroller 905 detects a touch input, then the microcontroller 905 enters the touch command mode at step S1406.

In the touch command mode, the mode control transistor 920 is maintained in the OFF state to electrically isolate the contact 320, lead 710 and resistor 910 from at least the heater 14 and the negative terminal of the power supply 1. Since the default state of the mode control transistor U3 is ON, the microcontroller 905 maintains the mode control transistor U3 in the OFF state by preventing the charge monitoring signal EN_SIG from being enabled (or from being output) and turning on the mode control transistor 920.

Still referring to FIG. 14, after entering the touch command mode at step S1406, the microcontroller 905 detects a touch command input by the adult vaper at step S1408. According to at least some example embodiments, the microcontroller 905 detects the touch command input by the adult vaper based on the frequency and/or length of the touch by the adult vaper.

Once having detected the touch command input by the adult vaper at step S1408, the microcontroller 905 executes the detected touch command at step S1410.

The following tables illustrate example touch commands and operations executed in response to said touch inputs according to one or more example embodiments.

TABLE 1

| Battery Level On-Demand Indication Input = Single Tap on Contact Assembly Battery Charge Level (%) | Device Response |
|---|---|
| 100-20 | Display Solid White/Green LED for 5 seconds |
| 20-10 | Display Solid Yellow LED for 5 seconds |
| 10-0 | Display Solid Red LED for 5 seconds |
| 0 | Blink Solid Red LED 5 times (0.5 seconds on and 0.5 second off) |

TABLE 2

| Display while Vaping (Option 1) Input = Draw on Device Battery Charge Level (%) | Device Response |
|---|---|
| 100-20 | Display Solid White/Green LED during puff |
| 20-10 | Display Solid Yellow LED during puff |
| 10-0 | Display Solid Red LED during puff |
| 0 | Blink Solid Red LED 5 times (0.5 seconds on and 0.5 second off) |

TABLE 3

| Display while Vaping (Option 2) Input = Draw on Device Battery Charge Level (%) | Device Response |
|---|---|
| 100-0 | Display Solid White/Green LED during puff |
| 0 | Blink Solid Red LED 5 times (0.5 seconds on and 0.5 second off) |

TABLE 4

| LED Off Input = Press and Hold Contact Assembly for 5 seconds Battery Charge Level (%) | Device Response |
|---|---|
| 100-0 | none |

In at least one example embodiment, as shown in Tables 1-4, the e-vaping device may respond to a variety of different touch commands. In other example embodiments, the vaping profile may be altered by inputs or the device may be locked from vaping by tapping the contact assembly.

Still referring to FIG. 14, although not shown explicitly, after executing the detected touch command, the microcontroller 905 may return to the monitoring mode.

Figure 15:
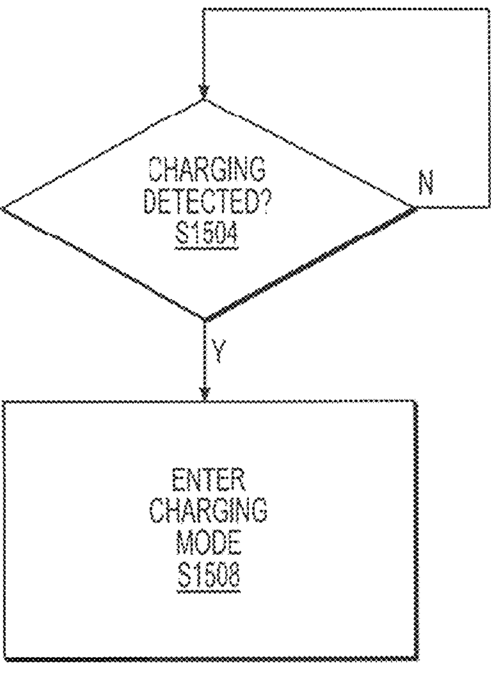
FIG. 15 is a flow chart illustrating another example embodiment of a method of operating the control circuit shown in FIG. 6.

FIG. 15 is a flow chart illustrating another example embodiment of a method of operating the control circuit 200 shown in FIG. 6. The example embodiment shown in FIG. 15 will also be discussed with regard to the microcontroller 905 initially operating in the monitoring mode with the mode control transistor U3 in the ON state. However, example embodiments should not be limited to this example.

When the mode control transistor 920 is in the ON state, at step S1504 the microcontroller 905 determines whether the power supply 1 is being charged based on the charging enable signal CHG_EN from the charge controller 800. As mentioned above, the charge controller 800 outputs the charging enable signal CHG_EN based on the presence of the charging current $i_{CH}$ through the first contact 310 and the lead 700. In one example, the microcontroller 905 determines that the power supply 1 is being charged if the charge enable signal CHG_EN from the charge controller 800 is enabled (e.g., has logic high level). As discussed herein, the enabling of the charge enable signal CHG_EN may also be referred to as output of the charge enable signal CHG_EN.

If the microcontroller 905 detects that the power supply 1 is charging at step S1504, then the microcontroller 905 enters the charging mode at step S1508.

In the charging mode, the mode control transistor 920 remains in the ON state until the charge controller 800 indicates that the charging current $i_{CH}$ is no longer flowing to the positive terminal of the power supply 1 by disabling the charge enable signal CHG_EN. In one example, while in the charging mode, the microcontroller 905 maintains the mode control transistor 920 in the ON state by preventing disabling of the enabled charge monitoring signal EN_SIG.

Although not explicitly shown in FIG. 15, when the charge controller 800 disables the charge enable signal CHG_EN, the microcontroller 905 may return to the monitoring mode.

Returning to step S1504, if the microcontroller 905 does not detect that the power supply 1 is charging, then the microcontroller 905 remains in the monitoring mode and operates as discussed above.

As discussed above, the control circuit 200 further includes a resistance measurement circuit 94.

During puff events by an adult vaper, the application of power to the heater 14 changes the resistance of the heater 14. Using the resistance measurement circuit 94, the microcontroller 905 is configured to monitor resistance changes in the heater 14 during puff events, and to control power to the heater 14 based on the changes in resistance. In at least one example embodiment, the microcontroller 905 may selectively disable vaping operation by cutting power to the heater 14 based on changes in resistance of the heater 14.

In the resistance measurement circuit 94 shown in FIG. 6, the first resistor R1 is a precise reference resistor with known resistance value (e.g., about 10.00Ω). The resistors R2, R3 and R4 are stable resistors used to set the gain and bias of the OP-AMP 947. The resistors R2, R3, and R4 also have known resistance values. The DAC 9054 and the ADC 9052 share the same reference voltage $V_{battery}$. In this case, the reference voltage $V_{battery}$ is the voltage of the power supply 1. Given the configuration of the resistance measurement circuit 94 shown in FIG. 6, the voltage output $V_{op\text{-}amp}$ of the OP-AMP 947 is given by Equation (1) shown below.

$$V_{op-ramp} = \frac{R_2 + \frac{R_3 R_4}{R_3 + R_4}}{\frac{R_3 R_4}{R_3 + R_4}} * \frac{R_{coil}}{R_{coil} + R_1} * V_{battery} - \frac{R_2}{R_3} * \frac{\text{CODE}_{DAC}}{2^8} * V_{battery} \quad (1)$$

According to one or more example embodiments, the resistance measurement circuit 94 may operate in a calibration mode or phase and a monitoring mode or phase.

Figure 16:
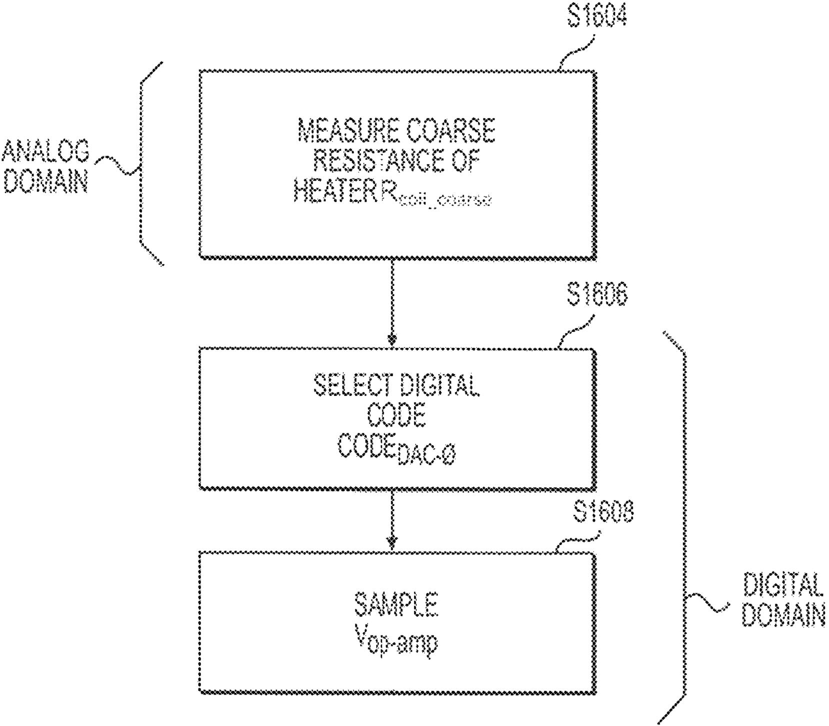
FIG. 16 is a flow chart illustrating an example embodiment of a method of operating the control circuit in the calibration phase.

FIG. 16 is a flow chart illustrating an example embodiment of a method of operating the control circuit 200 in the calibration phase. As discussed above, when a cartridge including a heater element (e.g., first section 70) is attached to the battery section (e.g., second section 72), the microcontroller 905 defaults to the active state. Additionally, when the cartridge including a heater element (e.g., first section 70) is attached to the battery section (e.g., second section 72), the control circuit 200 enters the calibration phase. The calibration phase is also referred to as the fine resistance calibration phase.

The stress on the heater 14 during a puff event may cause a shift in the "at-rest" resistance of the heater coil. In one example, during the first 5 to 10 puff events on a new cartridge, the "at-rest" resistance may change as much as 0.5% from a previous value. Accordingly, the microcontroller 905 may monitor the length of time between puff events, and if the time interval between puff events exceeds a threshold value (e.g., about 25 seconds), the control circuit 200 may also enter the calibration phase. Accordingly, the control circuit 200 may enter the calibration phase in response to at least two trigger events; that is, attachment of a new cartridge to the second section 72, and if the time interval between puff events exceeds a threshold value.

Referring to FIG. 16, in response to one or more of the above-mentioned trigger events, at step S1604 the microcontroller 905 measures the coarse resistance of the heater coil $R_{coil\_coarse}$ In this case, the coarse resistance of the heater coil is a low resolution measurement by the microcontroller 905 in the analog domain.

According to at least one example embodiment, the arrangement of heater 14 and the first resistor R1, which is a known stable resistance, in the resistance measurement circuit 94 presents a voltage at the sixth node NODE6, which is input to and/or sensed at the analog input ANALOG of the microcontroller 905. In this example, the first resistor R1 and the coil of the heater 15 create a voltage divider circuit. The microcontroller 905 then calculates the resistance of heater 14 based on the known voltage of the power supply (e.g., $V_{in}$), the sensed/measured voltage at the sixth node NODE6 (e.g., $V_{out}$) and the known resistance of the first resistor R1.

According to at least one other example embodiment, the OP-AMP 947 may be a component integrated in microcontroller 905. In this example, the coarse resistance measurement $R_{coil\_coarse}$ is acquired by reconfiguring the positive input of OP-AMP 947 as an ADC input of microcontroller 905. Once the pin is reconfigured, the arrangement of heater 14 and the first resistor R1, which is a known stable resistance, presents a voltage on NODE6 based on which the microcontroller 905 may calculate the resistance of heater 14. The microcontroller 905 may calculate the resistance of the heater 14 in the same manner as discussed above.

At step S1606, the microcontroller 905 selects an appropriate digital code or word $CODE_{DAC}$ based on the initial coarse resistance measurement $R_{coil\_coarse}$. According to at least one example embodiment, the microcontroller 905 selects the digital code $CODE_{DAC}$ so that the output voltage $V_{op\text{-}amp}$ of the OP-AMP 947 does not saturate the input of the ADC 9052 during subsequent measurements. In one example, the digital code $CODE_{DAC}$ may be selected such that the output of the OP-AMP 947 is substantially zero.

At step S1608, the ADC 9052 at the microcontroller 905 samples the voltage output $V_{op\text{-}amp}$ of the OP-AMP 947 to generate a digital representation $CODE_{ADC\_0}$ of the voltage output $V_{op\text{-}amp}$ of the OP-AMP 947.

After calibration, or between iterations of the calibration phase, the digital code $CODE_{DAC}$ is maintained to fix the voltage output of the DAC 9054.

causing the heater power control transistor U1 to switch on and off to regulate the voltage applied to the heater 14 by the power supply 1. Also during the regulating period of the duty cycle, the resistance measurement enable signal RES_MEAS_EN is disabled such that resistance measurement transistor U2 is maintained in the OFF (or open) state.

During the resistance measurement period, the heater power control transistor U1 is switched to the OFF (open) state, while the resistance measurement transistor U2 is maintained in the ON (closed) state for a given time interval sufficient to allow the microcontroller 905 to acquire a voltage sample from the output of the OP-AMP 947. In one example, the given time interval may be less than or equal to about 4 ms (e.g., about 1 ms).

Figure 17:
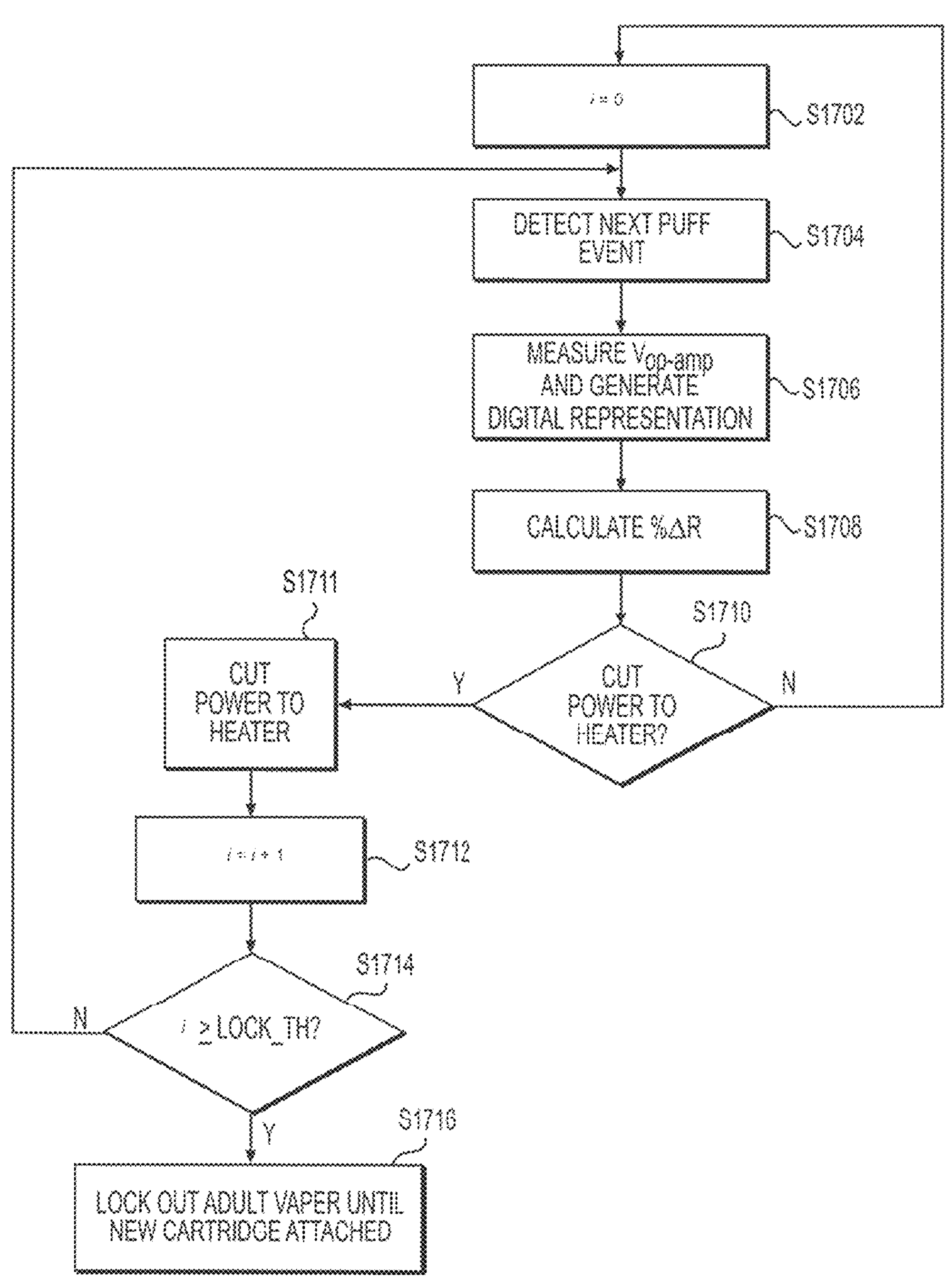
FIG. 17 is a flow chart illustrating an example embodiment of a method of operating the control circuit in the resistance measurement phase.

FIG. 17 is a flow chart illustrating an example embodiment of a method of operating the control circuit 200 in the resistance measurement phase. The method shown in FIG. 17 is performed during the resistance measurement period of the duty cycle during a puff event.

Referring to FIG. 17, in response to attaching a cartridge including a heater element (e.g., first section 70) to the battery section (e.g., second section 72), at step S1702 the microcontroller 905 initiates a counter value i for the cartridge to zero. The microcontroller 905 utilizes the counter value i to track the number of (e.g., consecutive) times power to the heater 14 is cutoff for the attached cartridge.

After initializing the counter value i, when the sensor 16 detects a puff event at step S1704, the microcontroller 905 measures/samples the output voltage $V_{op\text{-}amp}$ from the OP-AMP 947 at step S1706. The microcontroller 905 then generates an updated digital representation ($CODE_{ADC\_1}$) of the output voltage $V_{op\text{-}amp}$ of the OP-AMP 947 based on the sampled output voltage $V_{op\text{-}amp}$.

At step S1708, the microcontroller 905 then calculates the percentage change in resistance % ΔR between the initial measured resistance of the coil $R_{coil\_0}$ and the current resistance $R_{coil\_1}$ of the heater 14 based on the updated digital representation $CODE_{ADC\_1}$ of the output voltage $V_{op\text{-}amp}$ of the OP-AMP 947 according to Equation (2) shown below.

$$\%\ \Delta R = \frac{R_{coil\_1} - R_{coil\_0}}{R_{coil\_0}} = \frac{(R_{coil_0} + R_1)^2(\mathrm{CODE}_{ADC_1} - \mathrm{CODE}_{ADC\_0})}{R_{coil\_0}\left[2^{10} R_1 \frac{R_2 + \frac{R_3 R_4}{R_3 + R_4}}{\frac{R_3 R_4}{R_3 + R_4}} - (\mathrm{CODE}_{ADC_1} - \mathrm{CODE}_{ADC_0})(R_{coil_o} + R_1)\right]} \tag{2}$$

After detection of a puff event by the sensor 16 and during subsequent vaping, the heater power control signal HEAT_PWR_CTRL controls the heater power control transistor U1 to regulate the voltage output from the power supply 1 to the heater 14. According to at least one example embodiment, the heater power control signal HEAT_PWR_CTRL has a duty cycle of 64 ms. According to at least this example embodiment, the duty cycle includes a regulating period and a resistance measurement period. The regulating period may be one of the first and the last 60 milliseconds (ms) of the 64 ms, whereas the resistance measurement period may be the remaining portion of the duty cycle (e.g., one of the first and last 4 ms of the duty cycle).

During the regulating period of the duty cycle, the heater power control signal HEAT_PWR_CTRL is pulse train After calculating the percentage change in resistance % ΔR, at step S1710 the microcontroller 905 determines whether to cut power to the heater based on a comparison between the calculated percent change in resistance % ΔR and a threshold percentage change % $R_{TH}$. If the calculated percentage change in resistance % ΔR exceeds (e.g., is greater than) the threshold percentage change % $R_{TH}$, then at step S1711 the microcontroller 905 cuts power to the heater 14 by disabling the heater power control signal HEAT_PWR_CTRL thereby setting the heater power control transistor U1 to the OFF state (open).

The microcontroller 905 then increments the counter value i at step S1712, and determines whether the counter value i exceeds a counter threshold LOCK_TH at step S1714. The counter threshold LOCK_TH represents a threshold number of times the power to the heater 14 for the current cartridge may be temporarily cutoff before further vaping by the adult vaper using the current cartridge is prevented. The counter value i exceeds the counter threshold LOCK_TH if the counter value is greater than or equal to the counter threshold LOCK_TH. In one example, the counter threshold LOCK_TH may be about 5, but example embodiments should not be limited to this example.

If the microcontroller 905 determines that the counter value i exceeds the counter threshold LOCK_TH, then at step S1716 the microcontroller 905 prevents power from reaching the heater 14 until the current cartridge is removed and replaced. As with step S1711, the microcontroller 905 cuts power to the heater 14 by disabling the heater power control signal HEAT_PWR_CTRL thereby setting the heater power control transistor U1 to the OFF state (open).

Returning to step S1714, if the counter value i does not exceed the counter threshold LOCK_TH (i<LOCK_TH), then the process returns to step S1704 and the method continues as discussed above upon detection of a next puff event by the sensor 16.

Returning now to step S1710, if the microcontroller 905 determines % ΔR does not exceed the threshold percentage change % $R_{TH}$ (% ΔR<% $R_{TH}$), and thus, power to the heater 14 need not be cutoff, then the microcontroller 905 re-initializes the counter value i to zero at step S1702, and continues as discussed above upon detection of a next puff event by the sensor 16.

Although Equation (2) provides a complete analytic solution of the change in resistance, some assumptions may be made to simplify the equation. One assumption is that the resistance change is relatively small so that some intermediate steps may be linearized using Taylor expansion, thereby resulting in Equation (3) shown below.

$$\% \ \Delta R = \frac{R_{coil\_1} - R_{coil\_0}}{R_{coil\_0}} = \frac{(\text{CODE}_{ADC_1} - \text{CODE}_{ADC_0})}{2^{10}} \frac{\frac{R_3 R_4}{R_3 + R_4}}{R_2 + \frac{R_3 R_4}{R_3 + R_4}} \left( \frac{R_{12}}{R_{coil_0}} + 2 + \frac{R_{coil_0}}{R_1} \right) \quad (3)$$

Because of a potentially increased quiescent current draw, to use the capacitive touch channel on the microcontroller 905, the control circuit 200 may detect an effect of an adult vaper's body on the resistance of the circuit in at least one example embodiment. Differences in skin moisture should not affect the ability of the circuit to respond to an adult vaper's input.

As discussed above, according to one or more example embodiments, the mode control transistor 920 may be a MOSFET or NMOS transistor and may provide more reliable detection even when sensitivity of the capacitance measurement is decreased.

In at least one other example embodiment, a diode (not shown) may be added to the charge controller input. In this example, the diode acts as an open circuit until a charge voltage is present across the second contact 320 and the first contact 310.

Figure 7:
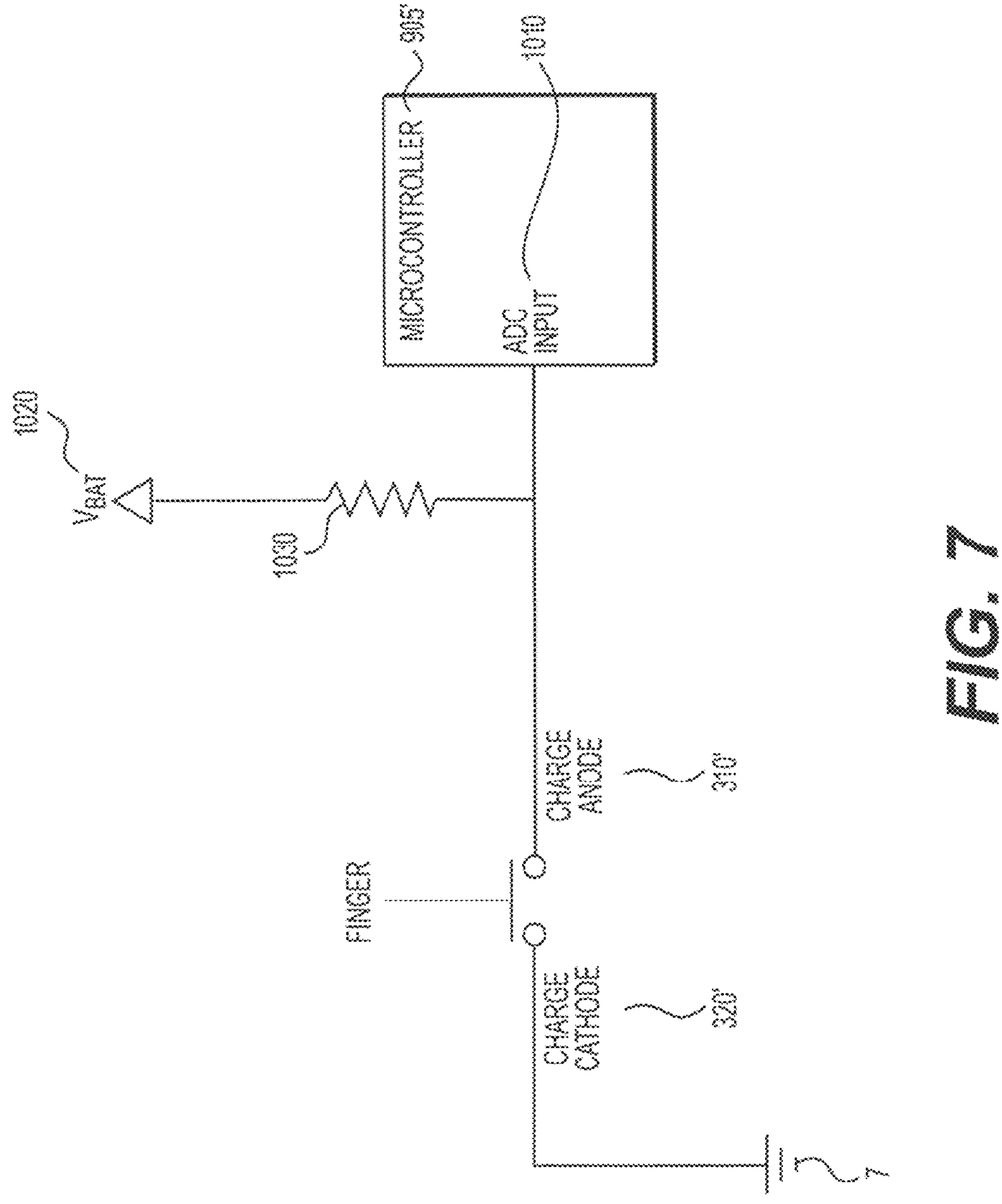
FIG. 7 is a diagram of a circuit of the e-vaping device of FIG. 1 according to at least one example embodiment.

FIG. 7 is a diagram of a control circuit according to another example embodiment.

In at least one example embodiment, an adult vaper's commands may be detected through changes in resistance, rather than capacitance. In this example, the second contact 320 is the charge cathode, which is electrically connected to the negative terminal 70 of the power supply. The first contact 310' is the charge anode, which is electrically connected to an input of an analog-to-digital (ADC) 1010 included in the microcontroller 905'.

According to at least this example embodiment, the microcontroller 905' may be configured to detect a resistance between the charge anode 310' and the charge cathode 320'. When an adult vaper places, for example, a finger on the across the charge anode 310' and the charge cathode 320', the connection between the charge anode 310' and the charge cathode 320' is closed thereby changing the resistance of the input to the microcontroller 905'. The microcontroller 905' detects this change in resistance to detect a touch input by the adult vaper.

The circuit of FIG. 7 may allow for a lower quiescent current draw. The resistive detection circuit may be configured as an interrupt to the microcontroller 905', which may allow for the microcontroller 905' and accessories to be in a low power sleep state until an adult vaper closes the circuit by touching the second contact 320 of the e-vaping device 60, which wakes the e-vaping device 60 so that an appropriate response to the touch may be given.

Figure 8:
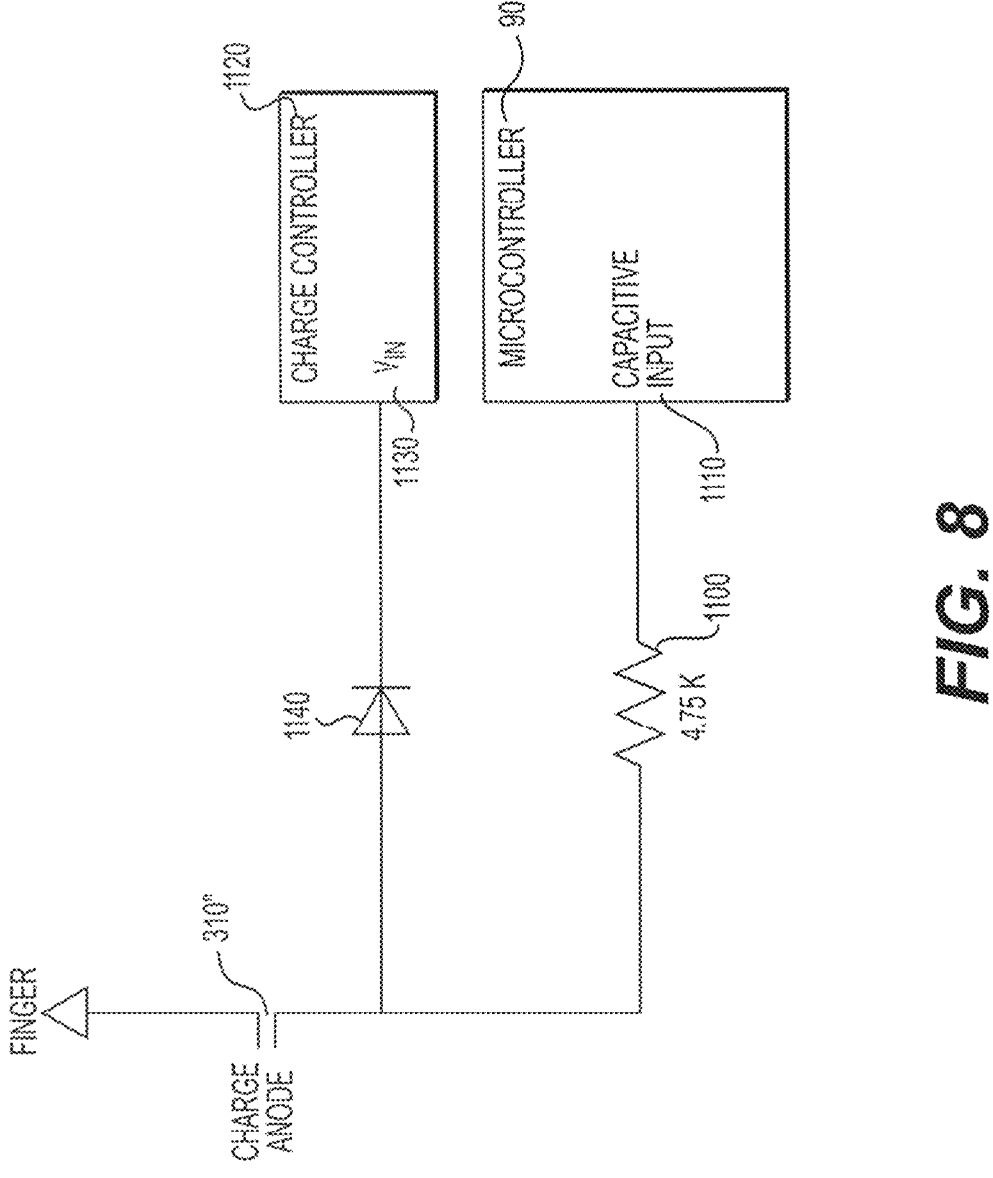
FIG. 8 is a diagram of a circuit of the e-vaping device of FIG. 1 according to at least one example embodiment.

FIG. 8 is a diagram of a control circuit according to yet another example embodiment.

In at least one example embodiment, as shown in FIG. 8, the first contact 310" is a charge anode, which is electrically connected to a charge controller 1120 via a diode 1140. The first contact 310" is also electrically connected to the capacitive input 1110 of the microcontroller 905" via a resistor 1100. In this example, the control circuit enables both resistive touch detection and capacitive touch detection by the e-vaping device 60.

According to at least this example embodiment, a more sensitive resistance measurement may be used to wake the e-vaping device 60 when an adult vaper touches the second contact 320 of the e-vaping device 60. After measuring the resistance, capacitance is measured to verify that the adult vaper has touched the second contact 320, and to suppress quiescent current draw requirements of circuits utilizing capacitive touch detection alone.

Figure 9:
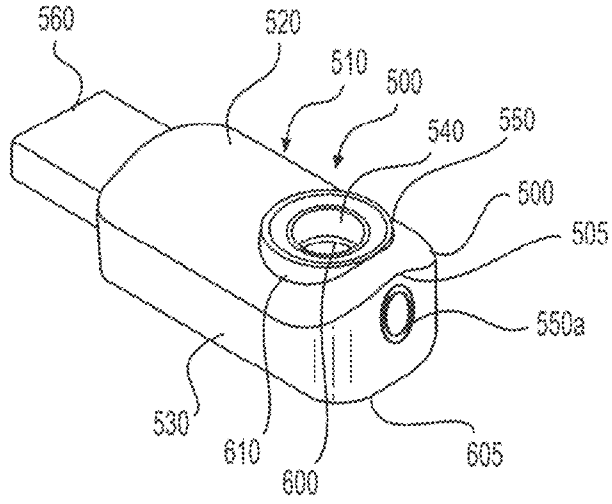
FIG. 9 is a perspective view of a charger of an e-vaping device according to at least one example embodiment.

FIG. 9 is a perspective view of a charger of an e-vaping device according to at least one example embodiment.

In at least one example embodiment, as shown in FIG. 9, the battery 1 of the e-vaping device 60 of FIGS. 1-8 may be recharged using a charger 500.

In at least one example embodiment, the charger 500 includes a housing 510 including a top wall 520. The top wall 520 may be rounded and/or generally bell-shaped or dome-shaped in cross-section, such that side portions of the top wall 520 are angled downward from a central portion of the top wall 520. The housing 510 may also include a sidewall 530 connected to the top wall 520. The top wall 520, at least one sidewall 530, and a bottom wall 535 (shown in FIG. 12) define an internal compartment that houses a charging circuit as discussed below. The housing 510 may be formed from one or more pieces of a material, such as a plastic or a metal.

In at least one example embodiment, the sidewall 530 has generally rounded corners, such that the sidewall 530 extends entirely about a perimeter of the charger 500. In at least one example embodiment, the sidewall 530 is integrally formed with the top wall 520, and edges where the sidewall 530 and top wall 520 meet are generally rounded.

In other example embodiments, the housing 510 may include four sidewalls 530 that meet at corners (not shown).

In at least one example embodiment, a charging slot 540 is formed in the top wall 520 of the housing 510. The charging slot 540 may be generally cylindrical. The charging slot 540 is defined by a bottom wall 600 and at least one internal side wall 610. The charging slot 540 may be sized and configured to receive the second end 220 of the e-vaping device 60. The bottom wall 600 may be generally flat. In other example embodiments, the bottom wall 600 may include bumps or curves.

In at least one example embodiment, a light pipe 550 substantially surrounds the charging slot 540. The light pipe 550 is generally tubular in shape, such that when the second end 220 of the e-vaping device 60 is inserted in the charging slot 540, the second end 220 passes through the light pipe 550. The light pipe 550 may include an extension 550*a* that extends through an internal compartment 525 and through a portion of the sidewall 530, such that the extension 550*a* is visible at a first end 605 of the charger 500. The light pipe 550 may be formed of a substantially transparent material that allows light from the e-vaping device 60 to be viewed while the e-vaping device 60 is docked in the charging slot 540. An apex 505 of the top wall 520 may be about a same height as a top surface of the light pipe 550.

In at least one example embodiment, the charger 500 also includes a USB plug 560. In other example embodiments, instead of a USB plug 560, a mini-USB plug or other power connection plug may be included with the charger 500. The charger 500 may be connected to a power source via the USB plug 560 to allow charging of the battery 1 of the e-vaping device 60 connected to the charger 500.

In at least one example embodiment, the housing 510 is smooth. In other example embodiments, the housing 510 may include bumps and/or ridges that assist in gripping of the charger 500 when plugging the USB plug 560 into an outlet or removing the USB plug 560 from the outlet.

Figure 10:
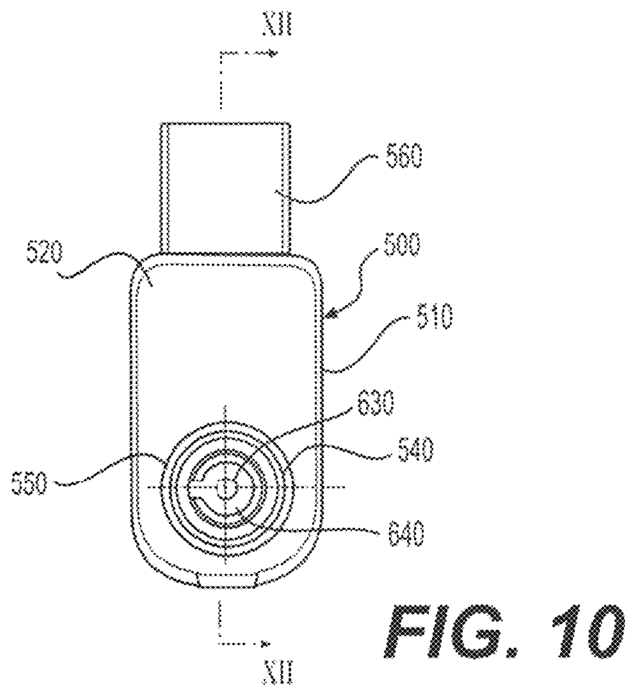
FIG. 10 is a top view of the charger of FIG. 9 according to at least one example embodiment.
Figure 12:
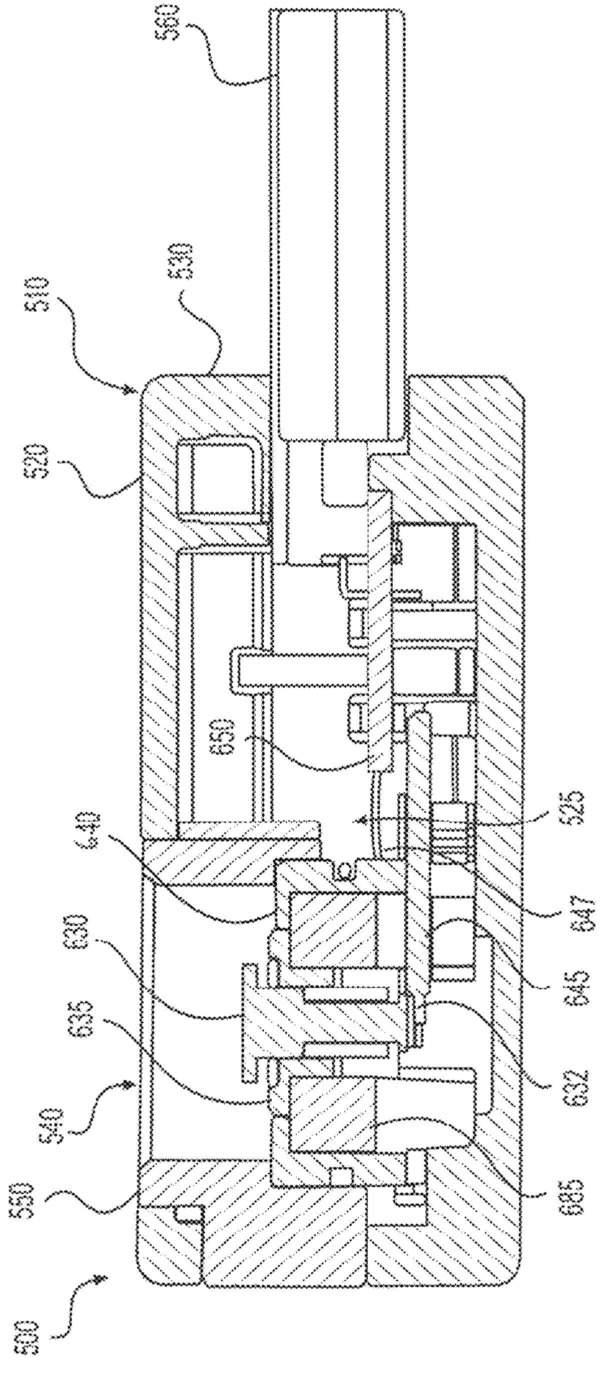
FIG. 12 is a cross-sectional view of the charger of FIG. 10 along line XII-XII according to at least one example embodiment.

FIG. 10 is a top view of the charger of FIG. 10 according to at least one example embodiment. FIG. 12 is a cross-sectional view of the charger of FIG. 10 along line XII-XII according to at least one example embodiment.

In at least one example embodiment, the charger 500 is the same as in FIG. 9. As shown, the charger 500 includes a first charging contact 630 and a second charging contact 640. At least one of the first charging contact 630 and the second charging contact 640 may be magnetic. The first charging contact 630 has a T-shaped cross-section with a circular, flat top surface projecting up into the charging slot 540. The first charging contact 630 is sized and configured to attract and/or contact the first contact 310 of the e-vaping device 60 so as to form a first electrical connection therewith and align the second end 220 of the e-vaping device 60 within the charging slot 540. The second charging contact 640 is cylindrical with a top surface having in inwardly projecting flange. The second charging contact 640 surrounds the first charging contact 630, and is electrically insulated from the first charging contact 630 by an insulator 635. The insulator 635 is cylindrical with a top surface having an outwardly projecting flange. The second charging contact 640 is sized and configured to attract and/or contact the second contact 320 of the e-vaping device 60 so as to form a second electrical connection therewith and align the second end 220 of the e-vaping device 60 within the charging slot 540. The first charging contact 630 and/or the second charging contact 640 may be formed of magnetic stainless steel or any other suitable material that provides good conduction and is magnetic.

Figure 11:
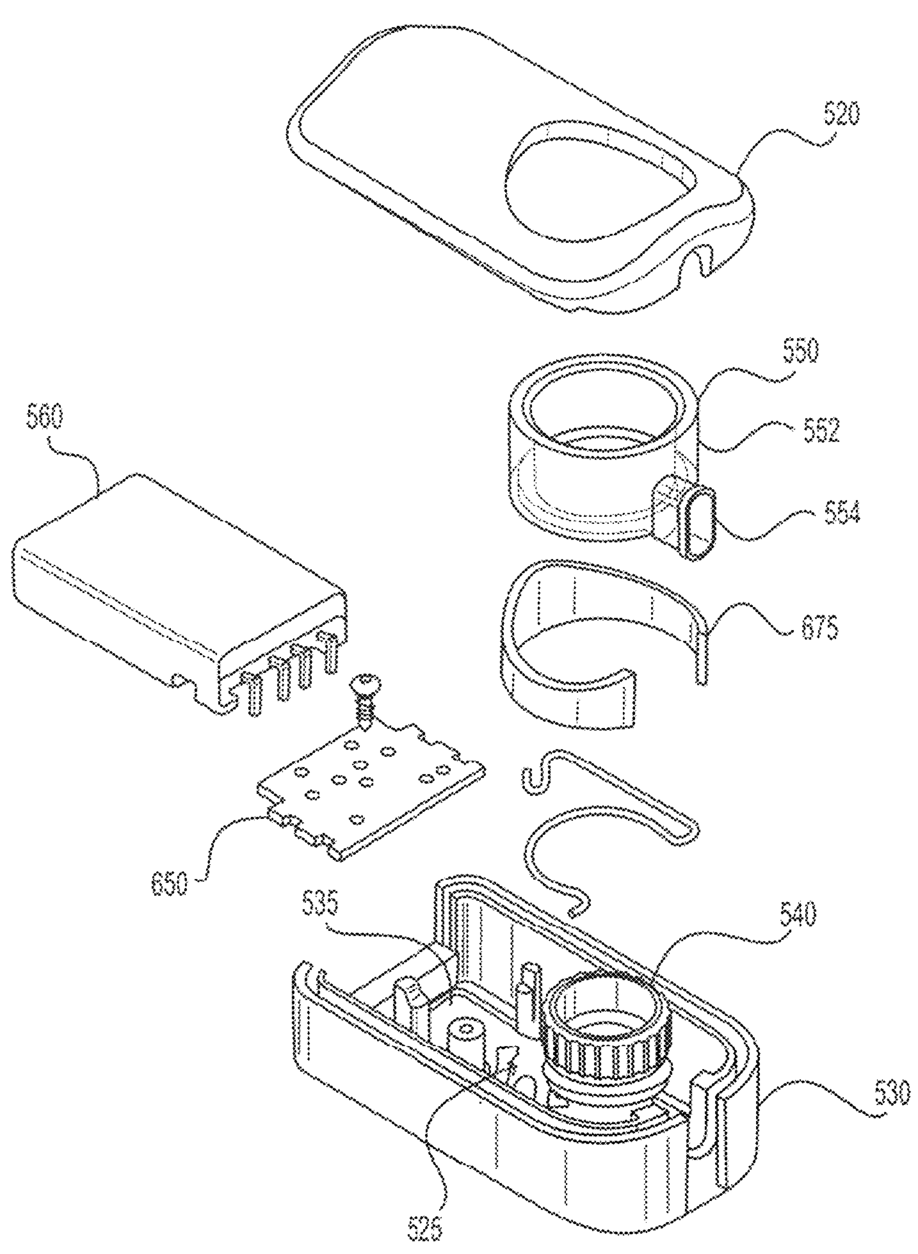
FIG. 11 is an exploded view of the charger of FIGS. 9 and 10 according to at least one example embodiment.
Figure 13:
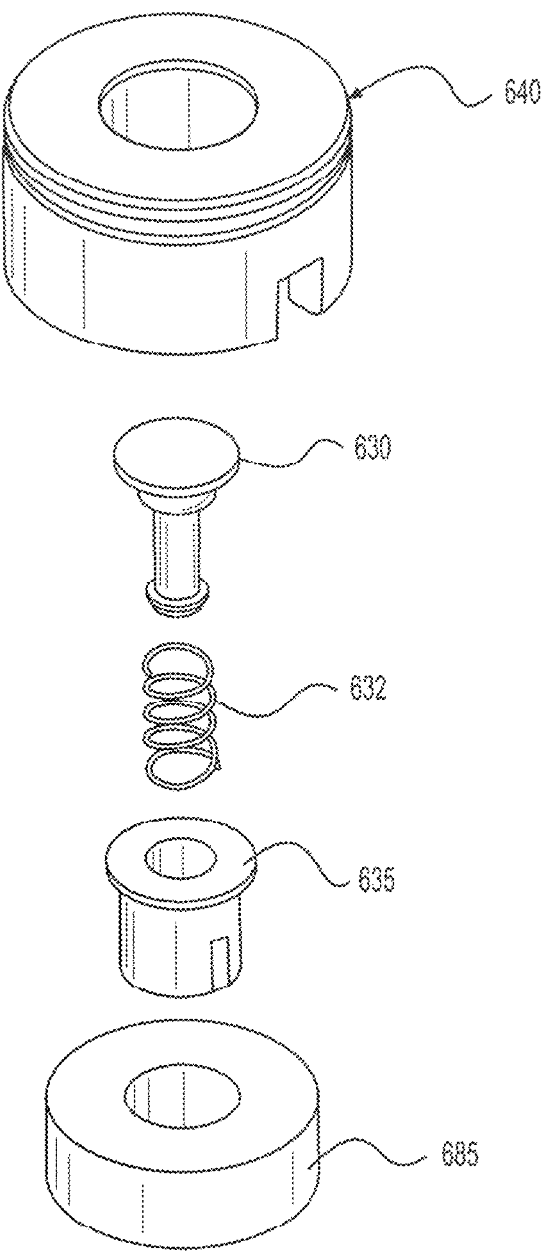
FIG. 13 is an exploded view of a charger contact assembly of the charger of FIGS. 9-12 according to at least one example embodiment.

As shown in FIG. 12, the internal components of the charger 500 are shown arranged within the internal compartment 525. As shown, the USB plug 560 extends through a sidewall 520 of the housing 510 into the internal compartment 525. The USB plug 560 is in direct electrical communication with a charger printed circuit board 650, which is in electrical communication with the first charging contact 630 and the second charging contact 640 via leads 645, 647. A magnet 683 is positioned beneath a portion of the second charging contact 640 and between the insulator 635 and the second charging contact 640. The flanges of the insulator 635 and the second charging contact 640 extend over the top surface of the magnet 683. The magnet 683 is cylindrical and the first charging contact 630 extends through a center of the magnet 683. The first charging contact 630 may be biased upwards into the charging slot by a spring 632 disposed within the insulator 635 such that the first charging contact 630 has a top surface that is above a top surface of the second charging contact 640 when no e-vaping device 60 is inserted in the charging slot 540. FIG. 13 shows an exploded view of a charger contact assembly of the charger of FIGS. 9-12. FIG. 11 is an exploded view of the charger of FIG. 9. In at least one example embodiment, a shroud 675 at least partially surrounds the light tube 550. The shroud 675 may substantially prevent and/or reduce visibility of light through a portion of the light tube 550. As shown, the light tube 550 may include a first tubular portion 552, and the extension 554, which extends through an outlet in the sidewall 525.

Example embodiments have been disclosed herein, it should be understood that other variations may be possible. Such variations are not to be regarded as a departure from the spirit and scope of the present disclosure, and all such modifications as would be obvious to one skilled in the art are intended to be included within the scope of the following claims.

We claim:

1. A battery section of an electronic vaping device, the battery section comprising:

a power supply;

a control circuit; and a conductive contact assembly at an end of the battery section, the conductive contact assembly electrically connecting the power supply and the control circuit, and the conductive contact assembly being configured to receive external power and to receive a touch input command, wherein the conductive contact assembly includes a first contact and a second contact, and the second contact is insulated from a conductive portion of the first contact.

2. The battery section of claim 1, wherein the first contact is arranged at the end of the battery section, the first contact includes the conductive portion and a non-conductive portion, the conductive portion extends transverse to a longitudinal axis of the battery section, the non-conductive portion extends about a perimeter of the conductive portion, the second contact extends about a perimeter of the first contact, and the second contact at least partially overlaps the non-conductive portion.

3. The battery section of claim 1, wherein the first contact is configured as a charge anode when the external power is received by the conductive contact assembly;

the second contact is configured as a charge cathode when the external power is received by the conductive contact assembly; and the control circuit includes a switch configured to electrically separate the charge cathode from a common ground plane.

4. The battery section of claim 1, wherein the first contact includes the conductive portion and a non-conductive portion, and the second contact is insulated from the conductive portion by the non-conductive portion.

5. The battery section of claim 4, wherein the second contact extends about a perimeter of the non-conductive portion.

6. The battery section of claim 1, wherein the conductive contact assembly comprises:

an end cap housing including at least one slot, the end cap housing configured to hold the first contact.

7. The battery section of claim 6, wherein the conductive contact assembly includes at least one tab extending along a longitudinal axis of the battery section, the at least one tab configured to engage with the at least one slot.

8. The battery section of claim 1, wherein at least a portion of the conductive contact assembly is magnetic.

9. The battery section of claim 1, wherein, based on an operating mode of the control circuit, the control circuit is configured to either (i) charge the power supply through the conductive contact assembly or (ii) monitor the conductive contact assembly for the touch input command.

10. The battery section of claim 1, wherein the control circuit is configured to one of (i) charge the power supply through the conductive contact assembly or (ii) monitor the conductive contact assembly for the touch input command.

11. The battery section of claim 10, wherein the control circuit is configured to disable charging of the power supply when monitoring the conductive contact assembly for the touch input command.

12. The battery section of claim 10, wherein the control circuit is configured to disable monitoring of the conductive contact assembly for the touch input command when charging of the power supply is enabled.

13. An electronic vaping device comprising:

a power supply;

a control circuit;

a reservoir configured to hold a pre-vapor formulation;

a heater configured to heat pre-vapor formulation drawn from the reservoir, the heater electrically connected to the power supply; and a conductive contact assembly at an end of the electronic vaping device, the conductive contact assembly electrically connecting the power supply and the control circuit, and the conductive contact assembly being configured to receive external power and to receive a touch input command, wherein the conductive contact assembly includes a first contact and a second contact, and the second contact is insulated from a conductive portion of the first contact.

14. The electronic vaping device of claim 13, wherein the first contact is at the end of the electronic vaping device, the first contact includes the conductive portion and a non-conductive portion, the conductive portion extends transverse to a longitudinal axis of the electronic vaping device, the non-conductive portion extends about a perimeter of the conductive portion, the second contact extends about a perimeter of the first contact, and the second contact at least partially overlaps the non-conductive portion.

15. The electronic vaping device of claim 13, wherein the first contact is configured as a charge anode when the external power is received by the conductive contact assembly;

the second contact is configured as a charge cathode when the external power is received by the conductive contact assembly; and the control circuit includes a switch configured to electrically separate the charge cathode from a common ground plane.

16. The electronic vaping device of claim 13, wherein the first contact includes the conductive portion and a non-conductive portion, and the second contact is insulated from the conductive portion by the non-conductive portion.

17. The electronic vaping device of claim 16, wherein the second contact extends about a perimeter of the non-conductive portion.

18. The electronic vaping device of claim 13, wherein the conductive contact assembly comprises:

an end cap housing including at least one slot, the end cap housing configured to hold the first contact.

19. The electronic vaping device of claim 18, wherein the conductive contact assembly includes at least one tab extending along a longitudinal axis of the electronic vaping device, the at least one tab configured to engage with the at least one slot.

20. The electronic vaping device of claim 13, wherein at least a portion of the conductive contact assembly is magnetic.

21. The electronic vaping device of claim 13, wherein, based on an operating mode of the control circuit, the control circuit is configured to either (i) charge the power supply through the conductive contact assembly or (ii) monitor the conductive contact assembly for the touch input command.

22. The electronic vaping device of claim 13, wherein the control circuit is configured to one of (i) charge the power supply through the conductive contact assembly or (ii) monitor the conductive contact assembly for the touch input command.

23. The electronic vaping device of claim 22, wherein the control circuit is configured to disable charging of the power supply when monitoring the conductive contact assembly for the touch input command.

24. The electronic vaping device of claim 22, wherein the control circuit is configured to disable monitoring of the conductive contact assembly for the touch input command when charging of the power supply is enabled.

* * * * *